United States Patent
Ishikawa et al.

(10) Patent No.: US 7,569,476 B2
(45) Date of Patent: Aug. 4, 2009

(54) SEMICONDUCTOR INTEGRATED CIRCUIT DEVICE AND A METHOD OF MANUFACTURING THE SAME

(75) Inventors: Kensuke Ishikawa, Ome (JP); Tatsuyuki Saito, Ome (JP); Masanori Miyauchi, Ome (JP); Toshio Saito, Akiruno (JP); Hiroshi Ashihara, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/444,316

(22) Filed: Jun. 1, 2006

(65) Prior Publication Data

US 2006/0216925 A1    Sep. 28, 2006

Related U.S. Application Data

(63) Continuation of application No. 10/263,829, filed on Oct. 4, 2002, now Pat. No. 7,095,120.

(30) Foreign Application Priority Data

Oct. 4, 2001    (JP)    ............................. 2001-309007

(51) Int. Cl.
H01L 21/4763    (2006.01)

(52) U.S. Cl. ........................ 438/622; 438/637; 257/758; 257/762; 257/E21.577

(58) Field of Classification Search ................ 438/622, 438/628, 637, 634; 257/758, 762, E21.577
See application file for complete search history.

(56) References Cited

U.S. PATENT DOCUMENTS 4,666,737 A * 5/1987 Gimpelson et al. .......... 438/629

4,720,908 A    1/1988 Wills (Continued)

FOREIGN PATENT DOCUMENTS

KR    1999-0082160    11/1999

(Continued)

OTHER PUBLICATIONS

Wada, J-I, et al., "Cu Damascene Process for 0.13 um Technology Generation using Self Ion Sputtering (SIS) with Ion Reflector", Jun. 5-7, 2000, Proceed. of IEEE 2000 Internat. Interconnect Tech. Conf., p. 108-10.

(Continued)

*Primary Examiner*—Phat X Cao
(74) *Attorney, Agent, or Firm*—Antonelli, Terry, Stout & Kraus, LLP.

(57) ABSTRACT

In manufacturing a semiconductor integrated circuit device, an interconnect trench and a contact hole are formed in an interlayer insulating film formed over a first-level interconnect on a semiconductor substrate, a barrier film is formed inside of the trench and contact hole so that its film thickness increases from the center of the bottom of the hole toward the sidewalls all around the bottom of the contact hole, a copper film is formed over the barrier film, and a second-level interconnect and a connector portion (plug) are formed by polishing by CMP. In this way, the geometrically shortest pathway of an electrical current flowing from the second-level interconnect toward the first-level interconnect through a connector portion (plug) does not coincide with a thin barrier film portion which has the lowest electrical resistance, so that the current pathway can be dispersed and a concentration of electrons does not occur readily.

12 Claims, 36 Drawing Sheets

U.S. PATENT DOCUMENTS

| | | | |
|---|---|---|---|
| 5,309,023 A | 5/1994 | Motonami et al. | |
| 5,371,041 A | 12/1994 | Liou et al. | |
| 5,730,835 A | 3/1998 | Roberts et al. | |
| 5,739,579 A | 4/1998 | Chiang et al. | |
| 5,891,513 A | 4/1999 | Dubin et al. | |
| 5,998,295 A | 12/1999 | Madurawe | |
| 6,157,078 A | 12/2000 | Lansford | |
| 6,181,012 B1 | 1/2001 | Edelstein et al. | |
| 6,218,283 B1 * | 4/2001 | Park et al. | 438/622 |
| 6,420,786 B1 | 7/2002 | Gonzalez et al. | |
| 6,461,955 B1 * | 10/2002 | Tsu et al. | 438/618 |
| 6,534,866 B1 | 3/2003 | Trivedi et al. | |
| 6,576,543 B2 * | 6/2003 | Lin et al. | 438/622 |
| 6,586,842 B1 | 7/2003 | You et al. | |
| 6,590,288 B1 | 7/2003 | Woo et al. | |
| 6,613,664 B2 * | 9/2003 | Barth et al. | 438/629 |
| 6,650,017 B1 * | 11/2003 | Akamatsu et al. | 257/765 |
| 6,667,231 B1 * | 12/2003 | Wu | 438/628 |

OTHER PUBLICATIONS

Okutani, K., et al., Properties of Aluminum Film Deposited by Low Energy and High Density Ion Bias Sputtering Method using Cusp Magnetic Field Electrode:, Jun. 12-3, 1990, VMIC Conference Proc. (IEEE), pp. 296-302.

"Semlcon West 2000", Nikkei Microdevice, pp. 65-66.

* cited by examiner

SEMICONDUCTOR INTEGRATED CIRCUIT DEVICE AND A METHOD OF MANUFACTURING THE SAME

The present Application is a continuation of U.S. application Ser. No. 10/263,829, filed Oct. 4, 2002, U.S. Pat. No. 7,095,120, the entire disclosure of which is hereby incorporated by reference.

CROSS-REFERENCE OF RELATED APPLICATIONS

U.S. application Ser. No. 10/327,024, filed Dec. 24, 2002, now U.S. Pat. No. 7,018,919, is related to the present application in that it was filed as a separate continuation of the same original patent application as that of the present application.

TECHNICAL FIELD

The present invention relates to a semiconductor integrated circuit device; and, more particularly, the invention relates to a technique that is effective when applied to the formation of a connector portion between interconnects in a semiconductor integrated circuit device.

BACKGROUND OF THE INVENTION

With a recent tendency toward miniaturization of interconnects and multilevel metallization in a semiconductor integrated circuit device, a so-called damascene technique for use in the formation of interconnects or the like, by forming a trench in an insulating film and then embedding a conductive film inside of the trench, has been under investigation.

This damascene technique includes a single damascene method of embedding a trench for an interconnect and a trench for connecting between interconnects by two different steps and a dual damascene method of simultaneously embedding these two trenches. As a conductive film to be embedded in these trenches, a copper film or the like having a small electrical resistance is used.

Inside of the trench, a conductive film having a barrier property (which will hereinafter be called a "barrier film") is formed in order to prevent diffusion of a metal into an insulating film, such as the copper constituting the conductive film to be embedded, or in order to improve the adhesion between the conductive film to be embedded and the insulating film.

For instance, in NIKKEI MICRODEVICES, PP 65 to 66(July, 2000), it is pointed out as a problem that, upon formation of an underlying film on the inside wall of a hole by sputtering, sputter particles move easily at the peripheral part of a wafer, thereby deteriorating the ability to uniformly cover the holes.

SUMMARY OF THE INVENTION

The present inventors have carried out an investigation on ways to effect an improvement in the reliability of interconnects or the like formed by the damascene technique and have found that the reliability of the damascene wiring has a close relation to the way the barrier film has adhered inside of the trench.

More specifically, the barrier film is required to have a sufficient thickness in order to prevent diffusion of a metal in an insulating film, such as the copper constituting a conductive film to be embedded in a trench, and to improve adhesion of the conductive film to be embedded in the trench with the insulating film.

When the barrier film has a poor coverage property, the thickness of the barrier film varies on the bottom or sidewalls of the trench. If the entire barrier film is formed to be thick so as to prevent such unevenness, the aspect ratio of a hole to be embedded with a conductive film becomes large, causing an embedding failure of the conductive film.

The barrier film has a higher electrical resistance than the conductive film to be embedded in the trench. If the barrier film is made excessively thick, the electrical resistance of an interconnect or connector portion becomes large, thereby disturbing high-speed operation of a semiconductor integrated circuit device.

The barrier film is thus required to have a thickness not greater than a predetermined thickness. If some portions of the barrier film are thin owing to uneven thickness, they provide a current pathway because a smaller resistance exists at these portions. Particularly at contact holes, if the shortest distance of a current pathway and such a portion coincide with each other, a concentration of electrons occurs. As a result, so-called electromigration, that is, attraction of metal atoms from such portions by electrons occurs. Voids appear at portions after the metal atoms have been transferred, and a connection failure or disconnection occurs.

An object of the present invention is to optimize the structure of a connector portion for connecting interconnects, thereby improving the electromigration properties.

Another object of the present invention is to optimize the structure of a barrier film at a connector portion between interconnects, thereby improving the characteristics of a semiconductor integrated circuit device.

The above-described objects and other objects, advantages and novel features of the present invention will be apparent from the description herein and the accompanying drawings.

An outline of typical aspects of the invention, among the embodiments disclosed in the present application, will next be described briefly.

(1) In one aspect of the present invention, there is provided a semiconductor integrated circuit device which has a hole made in an insulating film formed over a semiconductor substrate; a first conductive film formed on the bottom and sidewalls of the hole, which film has a film thickness increasing from the center of the bottom toward the sidewalls of the hole; and a second conductive film that is formed over the first conductive film and embedded inside of the hole.

(2) In another aspect of the present invention, there is provided a semiconductor integrated circuit device which has a hole made in an insulating film formed over a semiconductor substrate; a first conductive film formed on the bottom and sidewalls of the hole, which film is smaller in film thickness B at the center of the bottom of the hole than in film thickness A corresponding to a perpendicular line extending toward the bottom of the hole from the shortest point from the corner of the bottom of the hole to the surface of the first conductive film; and a second conductive film that is formed over the first conductive film and embedded inside of the hole.

(3) In a further aspect of the present invention, there is provided a semiconductor integrated circuit device which has a hole made in an insulating film formed over a semiconductor substrate; a first conductive film formed on the bottom and sidewalls of the hole, which film has an electrical resistance lower at the center of the bottom of the hole than at a portion corresponding to a perpendicular line extending toward the bottom of the hole from the shortest point from the corner of the bottom of the hole to the surface of the first conductive film; and a second conductive film that is formed over the first conductive film and embedded inside of the hole.

(4) In a still further aspect of the present invention, there is provided a semiconductor integrated circuit device which has a first interconnect formed over a semiconductor substrate; a hole which is made in an insulating film formed over the first interconnect and having a bottom from which the first interconnect is exposed; a first conductive film formed on the bottom and sidewalls of the hole; a second conductive film formed over the first conductive film and embedded inside of the hole; and a second interconnect formed over the second conductive film, wherein a site at which a shortest pathway from the first interconnect to the second interconnect through the first and second conductive films cuts across the first conductive film does not coincide with the lowest electrical resistance site of the first conductive film.

(5) In a still further aspect of the present invention, there is provided a semiconductor integrated circuit device, which comprises a first interconnect formed over a semiconductor substrate, an insulating film formed over the first interconnect, a hole which is made in the first interconnect and the insulating film and has a bottom positioned deeper than the surface of the first interconnect, a first conductive film which is formed on the bottom and sidewalls of the hole and is greater in the film thickness E of the sidewall portion of the hole contiguous to the surface of the first interconnect than in the film thickness B at the center of the bottom of the hole, and a second conductive film that is formed over the first conductive film and is embedded therewith inside of the hole.

DETAILED DESCRIPTION OF THE INVENTION

Figure 1:
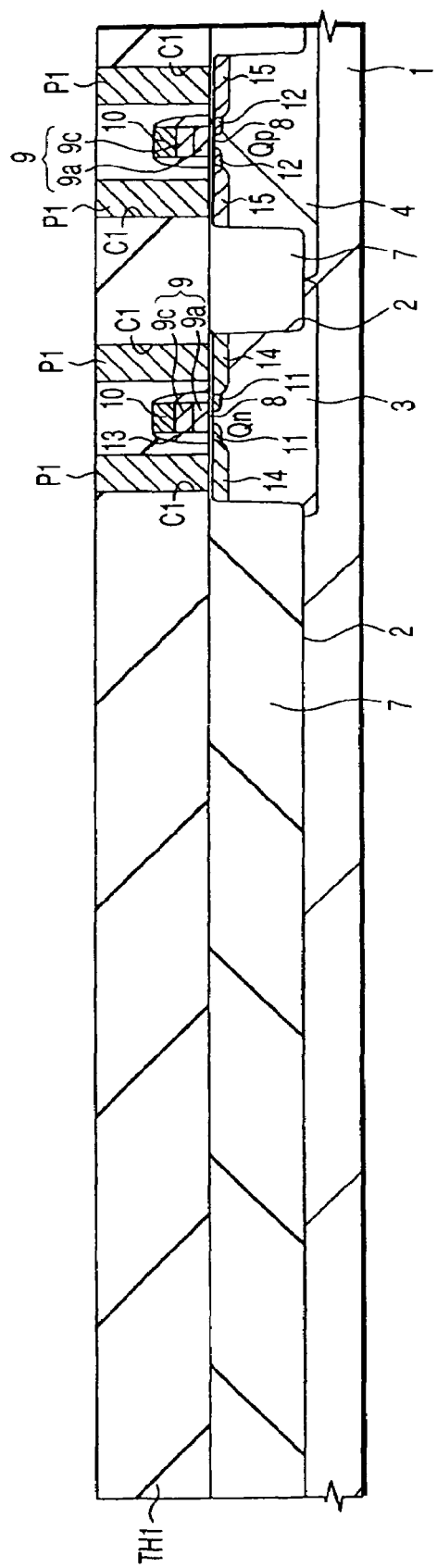
FIG. 1 is a fragmentary cross-sectional view of a substrate illustrating a manufacturing method of a semiconductor integrated circuit device according to Embodiment 1 of the present invention.

Various embodiments of the present invention will be described hereinafter with reference to the accompanying drawings. In all the drawings, members having like functions will be identified by like reference numerals, and overlapping descriptions thereof will be omitted Embodiment 1

The semiconductor integrated circuit device according to one Embodiment of the present invention will be described in accordance with its method of manufacture. FIGS. 1 to 18, 20 to 26, 31 and 32 are fragmentary cross-sectional or fragmentary plan views of a substrate for illustrating the method of manufacture of the semiconductor integrated circuit device according to Embodiment 1 of the present invention.

First, as illustrated in FIG. 1, an n channel MISFET (Metal Insulator Semiconductor Field Effect Transistor) Qn and a p channel MISFETQp are formed as one example of a semiconductor element. One example of the process used in the formation of these MISFET will be described next.

A semiconductor substrate 1 made of, for example, p type single crystal silicon is etched to form a trench therein. An insulating film, for example, a silicon oxide film 7 is then embedded inside of the trench, whereby an isolation region 2 is formed. This isolation region 2 defines an active region in which the MISFET is to be formed.

After ion implantation of a p type impurity and an n type impurity into the semiconductor substrate (which will hereinafter simply be called a "substrate") 1, these impurities are diffused by heat treatment to form a p type well 3 and an n type well 4. By thermal oxidation, a clean gate insulating film 8 is formed over the surface of each of the p type well 3 and n type well 4.

Over the gate insulating film 8, a low-resistance polycrystalline silicon film 9a, a thin WN (tungsten nitride) film (not illustrated) and a W (tungsten) film 9c are deposited successively as conductive films, followed by deposition of a silicon nitride film 10 thereover to serve as an insulating film.

The silicon nitride film 10 is then etched by dry etching or the like so as to leave it in a region in which a gate electrode is to be formed. Using the remaining silicon nitride film 10 as a mask, the W film 9c, WN film (not illustrated) and polycrystalline film 9a are etched by dry etching or the like, whereby a gate electrode 9, that is formed of the polycrystalline film 9a, WN film (not illustrated) and W film 9c, is formed.

By ion implantation of an n type impurity into the p type well 3, extending to both sides of the gate electrode 9 $n^-$ type semiconductor regions 11 are formed, while ion implantation of a p type impurity into the n type well 4 is performed to form $p^-$ type semiconductor regions 12.

A silicon nitride film is then deposited over the substrate 1 to serve as an insulating film, followed by anisotropic etching, whereby sidewall spacers 13 are formed on the sidewalls of the gate electrode 9.

By ion implantation of an n type impurity to the p type well 3, $n^+$ type semiconductor regions 14 (source and drain), having a higher impurity concentration than the $n^-$ type semiconductor regions 11, are formed; while, by ion implantation of a p type impurity to the n type well 4, $p^+$ type semiconductor regions 15 (source and drain), having a higher impurity concentration than the $p^-$ type semiconductor regions 12, are formed.

By the steps so far described, the n channel type MISFETQn and p channel type MISFETQp, having an LDD (Lightly Doped Drain) structure and being equipped with a source and a drain, are formed.

Next, an interconnect will be formed for electrically connecting the MISFETQn and MISFETQp. Steps for forming this interconnect will be described next.

First, as illustrated in FIG. 1, a silicon oxide film is deposited, to serve as an insulating film, over the MISFETQn and MISFETQp by CVD (Chemical Vapor Deposition). The surface of the silicon oxide film is then polished by chemical mechanical polishing (CMP) to planarize the surface, whereby an interlayer insulating film TH1 is formed.

Over the interlayer insulating film TH1, a photoresist film (not illustrated is formed). This film will hereinafter simply be called a "resist film". Using this resist film as a mask, the interlayer insulating film TH1 is etched to form a contact hole C1 over each of the $n^+$ type semiconductor regions 14 and $p^+$ type semiconductor regions 15 over the main surface of the semiconductor substrate 1.

A plug P1 is then formed in the contact hole C1 by depositing, over the interlayer insulating film TH1, including the inside of the contact hole C1, a tungsten (W) film to serve as a conductive film by CVD, and then this tungsten film is polished by CMP until the interlayer insulating film TH1 is exposed. Alternatively, this plug P1 may be formed to have a laminate structure of a barrier film—which has a single layer of a titanium nitride (TiN) film or a titanium (Ti) film, or a laminate film thereof—and a tungsten film.

Figure 2:
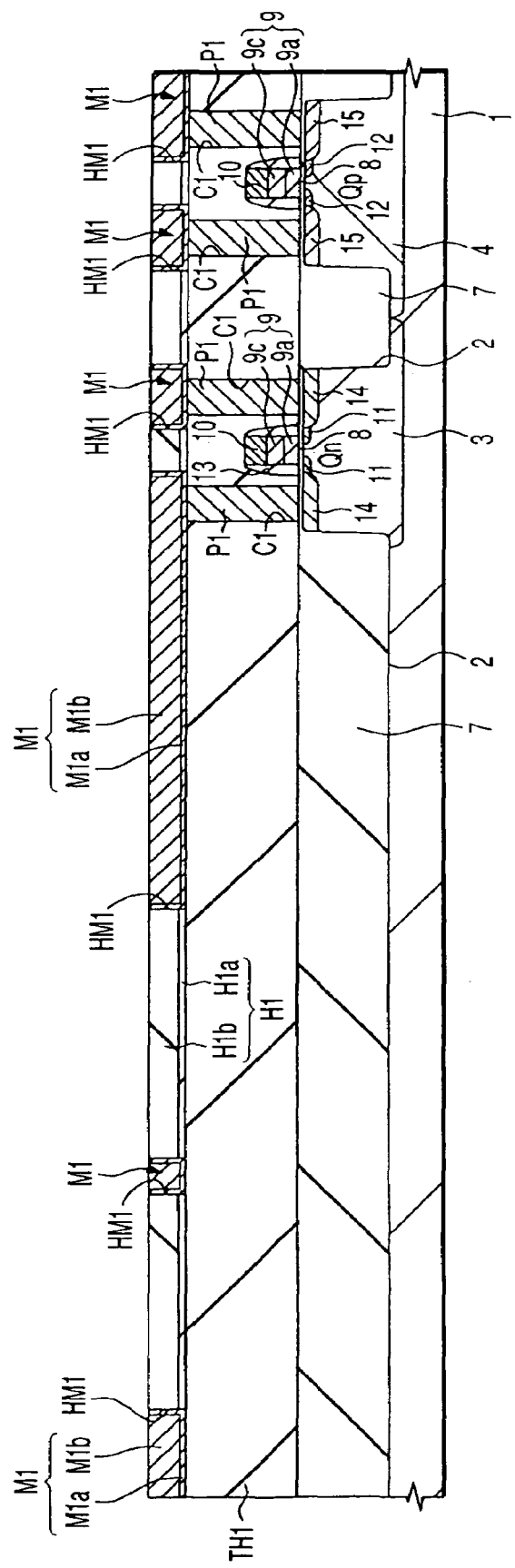
FIG. 2 is a fragmentary cross-sectional view of a substrate illustrating the manufacturing method of the semiconductor integrated circuit device according to Embodiment 1 of the present invention.

As illustrated in FIG. 2, a silicon nitride film H1a, serving as an etching stopper, and a silicon oxide film H1b are deposited successively by CVD to serve as an insulating film over the interlayer insulating film TH1 and plug P1, whereby an interconnect-trench-forming insulating film H1 made of these films is formed. The interconnect-trench-forming insulating film H1, in a region in which a first-level interconnect is to be formed, is etched to form an interconnect trench HM1. Instead of the silicon oxide film H1b, a silicon oxide film containing fluorine (F) may be used as an insulating film having a low dielectric constant. Another insulating film having a low dielectric constant or a coating type insulating film is also usable. The silicon nitride film H1a is utilized as an etching stopper during the above-described etching.

Over the interconnect-trench-forming insulating film H1, including the inside of the interconnect trench HM1, a barrier film M1a made of titanium nitride is deposited by sputtering. Then, a copper film M1b, serving as a conductive film, is formed over the barrier film M1a by electroplating. Prior to the formation of the copper film M1b by electroplating, a thin copper film may be formed by sputtering or CVD as a seed film for the electroplating.

After heat treatment of the copper film M1b, the copper film M1b and barrier film M1a outside of the interconnect trench HM1 are removed by CMP, whereby a first-level interconnect M1 is formed, having the copper film M1 and barrier film M1a.

Figure 3:
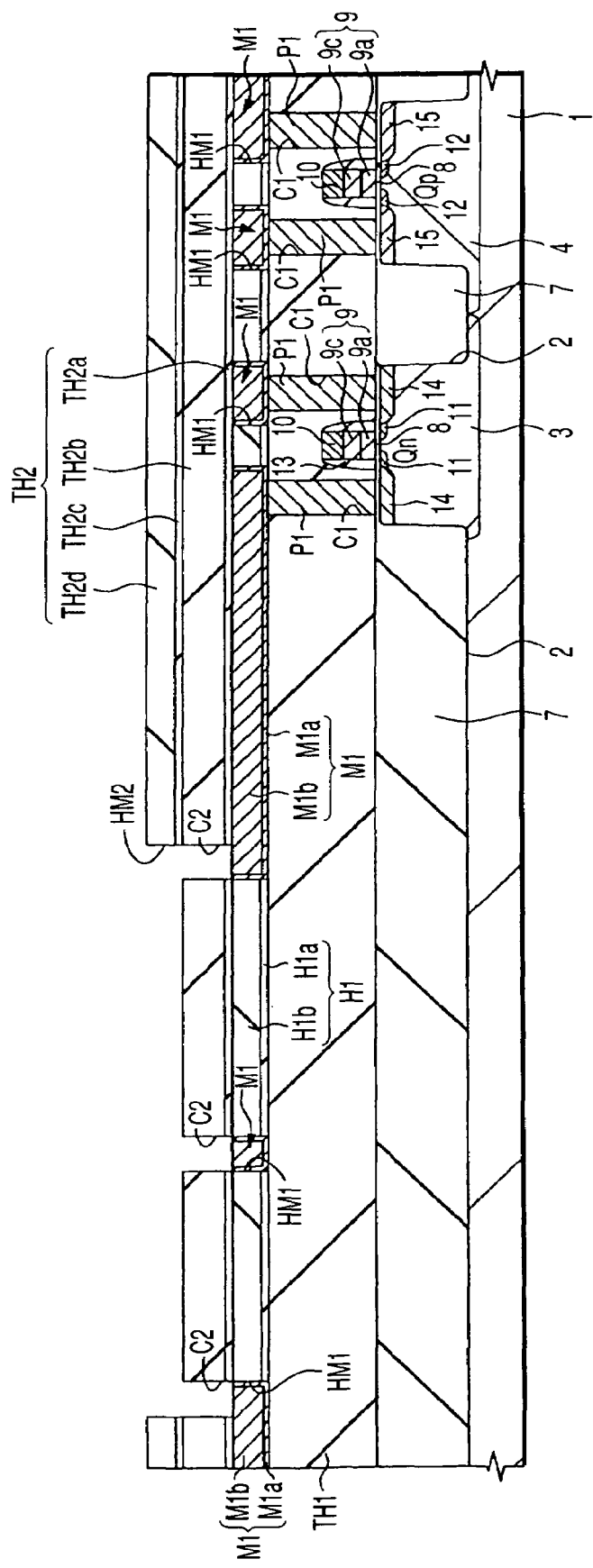
FIG. 3 is a fragmentary cross-sectional view of a substrate illustrating the manufacturing method of the semiconductor integrated circuit device according to Embodiment 1 of the present invention.

As illustrated in FIG. 3, a silicon nitride film TH2a, a silicon oxide film TH2b, a silicon nitride film TH2c and a silicon oxide film TH2d are deposited successively, to serve as insulating films, by CVD over the first-level interconnect M1, whereby an interlayer insulating film TH2 is formed. Among these films, the silicon nitride film TH2a has a function of preventing diffusion of copper, which constitutes the first-level interconnect M1. The silicon nitride film TH2a can be replaced with another insulating film so long as that film has a Cu diffusion preventing function. The silicon nitride film TH2a is used as an etching stopper upon formation of a contact hole C2, which will be described later. The silicon nitride film TH2c is utilized as an etching stopper upon formation of an interconnect trench HM2, which will be described later.

Over the interlayer insulating film TH2, a resist film (not illustrated), that is opened at a region in which a second-level interconnect is to be formed, is formed. Using this resist film as a mask, the silicon oxide film TH2d and silicon nitride film TH2c are etched from the interlayer insulating film TH2 to form the interconnect trench HM2.

Over the interlayer insulating film TH2, including the inside of the interconnect trench HM2, a first resist film (not illustrated) is deposited. The interconnect trench HM2 is embedded with the first resist film by etch back. A second resist film (not illustrated), that is opened at a connecting region of the first-level interconnect, with the second-level interconnect is then formed over the first resist film. Using this second resist film as a mask, the first resist film, the silicon oxide film TH2b and silicon nitride film TH2a are etched, whereby the contact hole C2 is formed.

Here, the formation of the interconnect trench HM2 is followed by the formation of the contact hole C2. Alternatively, after formation of the contact hole C2 by etching the silicon nitride film TH2a, silicon oxide film TH2b, silicon nitride film TH2c and silicon oxide film TH2d from a connecting region of the first-level interconnect with the second-level interconnect, the interconnect trench HM2 may be formed by etching the silicon oxide film TH2d and silicon nitride film TH2c from a region in which the second interlevel interconnect is to be formed.

Figure 4:
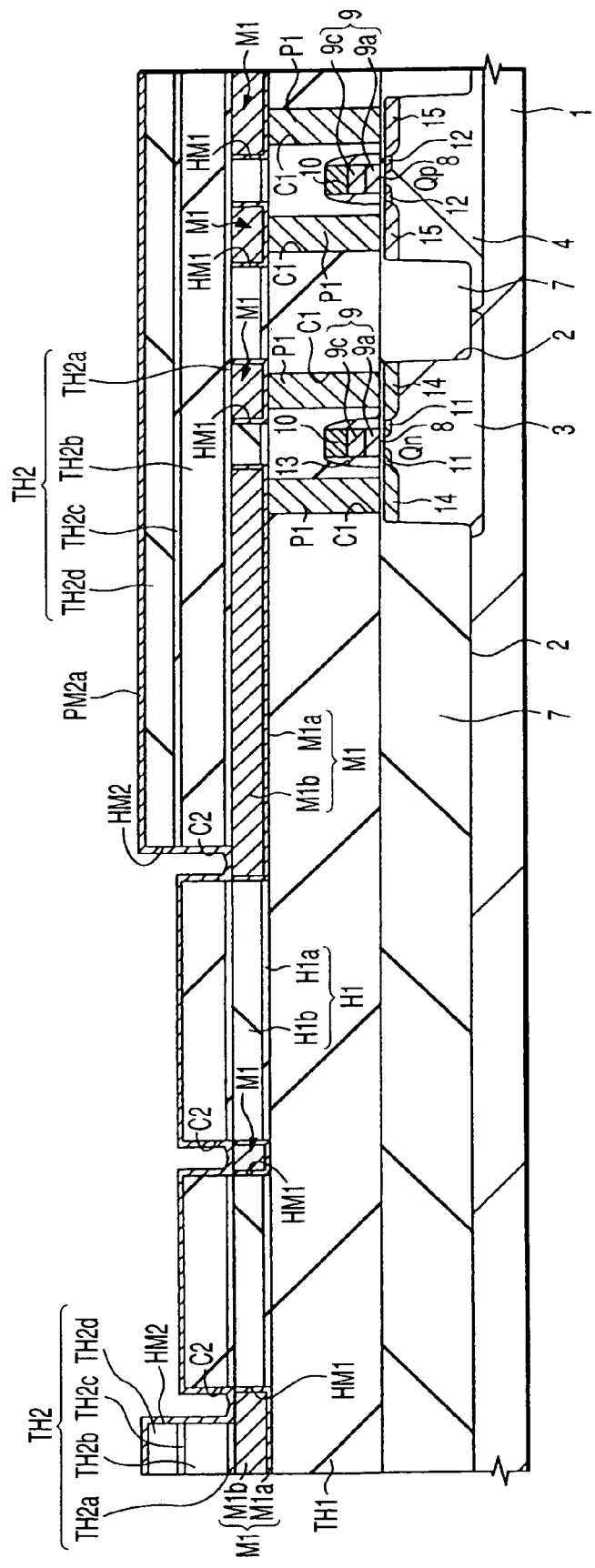
FIG. 4 is a fragmentary cross-sectional view of a substrate illustrating the manufacturing method of the semiconductor integrated circuit device according to Embodiment 1 of the present invention.

As illustrated in FIG. 4, over the interlayer insulating film TH2, including the insides of the contact hole 2C and interconnect trench HM2, the below-described refractory metal, such as titanium (Ti), is deposited to form a barrier film PM2a. As the refractory metal, at least one of or an alloy of titanium, tantalum (Ta), tantalum nitride (TaN), titanium nitride (TiN), tungsten (W), tungsten nitride, titanium silicide nitride and tungsten silicide nitride is usable. It is also possible to use a laminate film obtained by stacking the above-described films one upon another.

At this time, the barrier film PM2a is formed to have a structure as described below.

Figure 5:
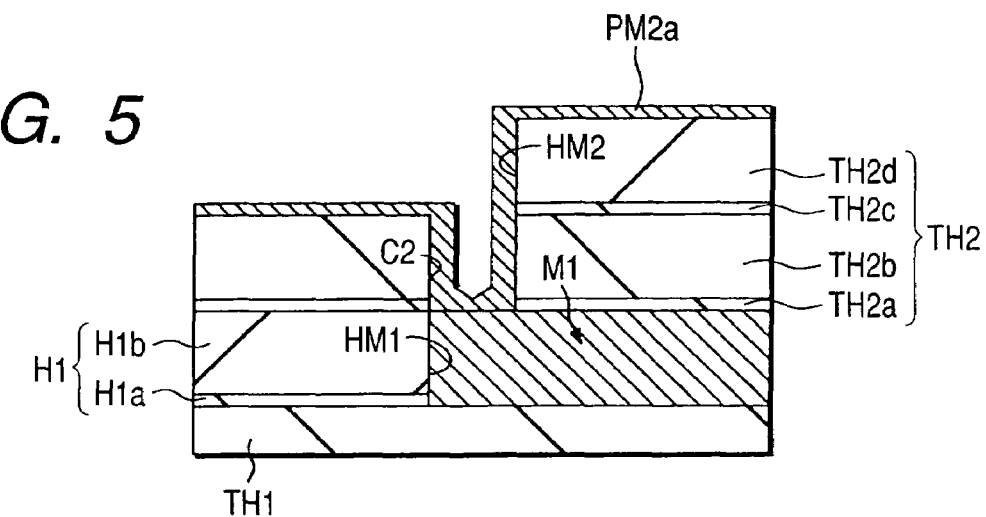
FIG. 5 is a fragmentary cross-sectional view of a substrate illustrating the manufacturing method of the semiconductor integrated circuit device according to Embodiment 1 of the present invention.
Figure 6:
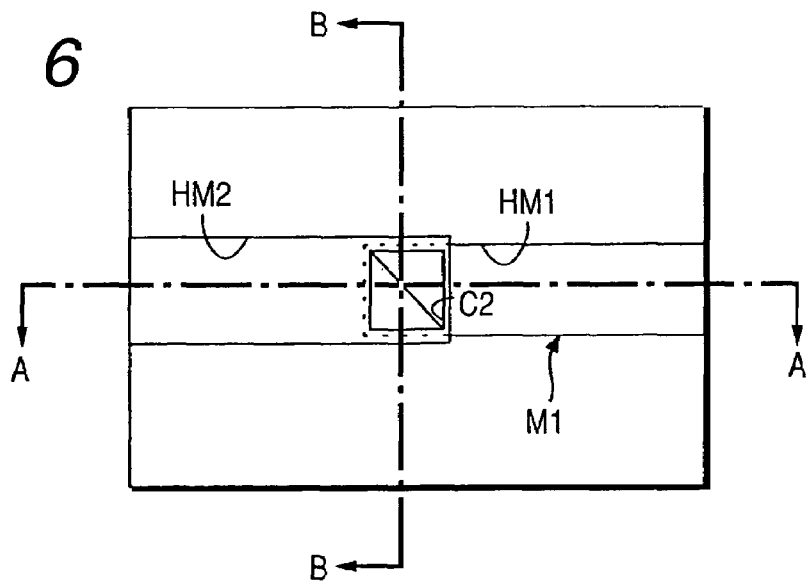
FIG. 6 is a fragmentary cross-sectional view of a substrate illustrating the manufacturing method of the semiconductor integrated circuit device according to Embodiment 1 of the present invention.
Figure 7:
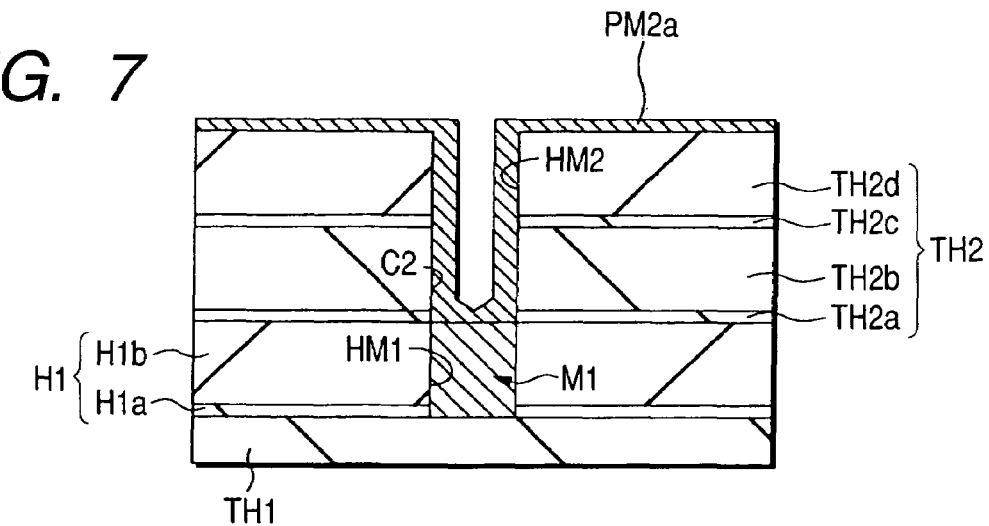
FIG. 7 is a fragmentary cross-sectional view of a substrate illustrating the manufacturing method of the semiconductor integrated circuit device according to Embodiment 1 of the present invention.

FIGS. 5 and 7 are enlarged views of the vicinity of the contact hole C2, which is the right-most one of three contact holes C2, as seen in FIG. 4. FIG. 6 is a fragmentary plan view of the substrate illustrated in FIG. 5 or FIG. 7. FIG. 5 corresponds to the cross-section taken along a line A-A of FIG. 6, while FIG. 7 corresponds to the cross-section taken along a line B-B of FIG. 6. Although no particular limitation is imposed, the width of the interconnect trench HM2 is formed to be substantially equal to that of the interconnect trench HM1 in this Embodiment. In FIG. 6, however, the width of the interconnect trench HM1 is illustrated as being smaller than that of the interconnect trench HM2 in order to facilitate observation of the elements in the drawing.

As illustrated in FIGS. 5 and 7, the barrier film PM2a is formed along the bottom and sidewalls of the interconnect trench HM2 and the contact hole C2.

Figure 8:
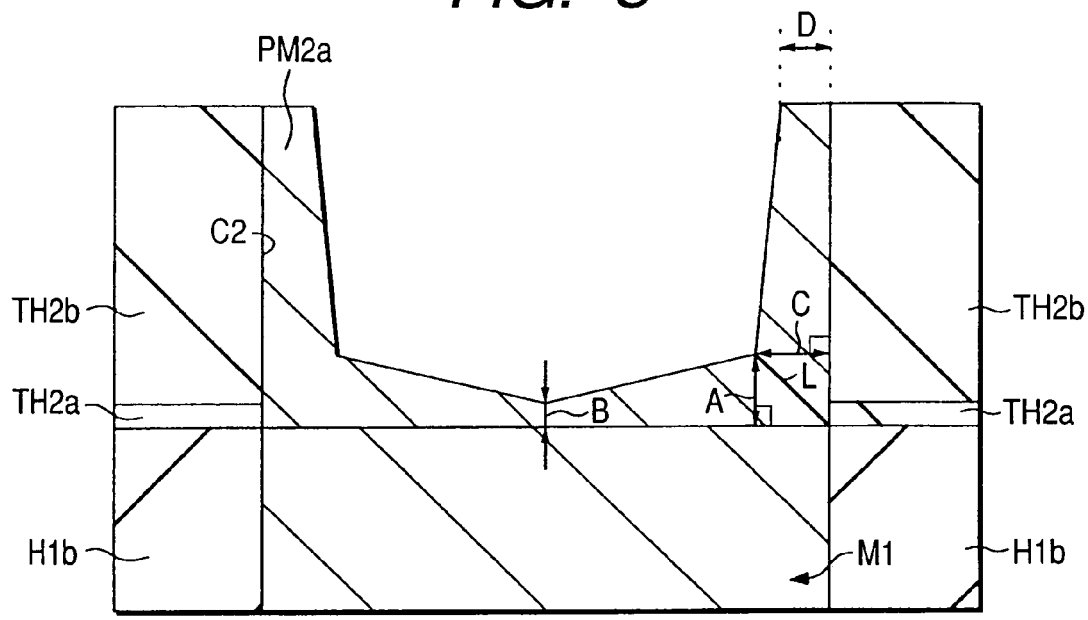
FIG. 8 is a fragmentary cross-sectional view of a substrate illustrating the manufacturing method of the semiconductor integrated circuit device according to Embodiment 1 of the present invention.

In the contact hole C2, the barrier film PM2a on the bottom thereof is formed so that its thickness increases from the center of the bottom toward the sidewalls. This increase in thickness of the barrier film PM2a on the bottom of the contact hole C2, from the center of the bottom toward the sidewalls, is applied all around the bottom. As illustrated in FIG. 8, which is a partially enlarged view of the bottom of the contact hole C2 shown in FIG. 7, the thickness of the barrier film at the center of the bottom of the contact hole C2 is B, and the film thickness A, which is a film thickness of the end portion, in the direction of the sidewalls, of the bottom of the contact hole C2, is made greater than the film thickness B (A≧B). Moreover, the film thickness C, which is a film thickness on the sidewalls at a bottom portion of the contact hole C2, is made greater than the film thickness B (C≧B).

Figure 9:
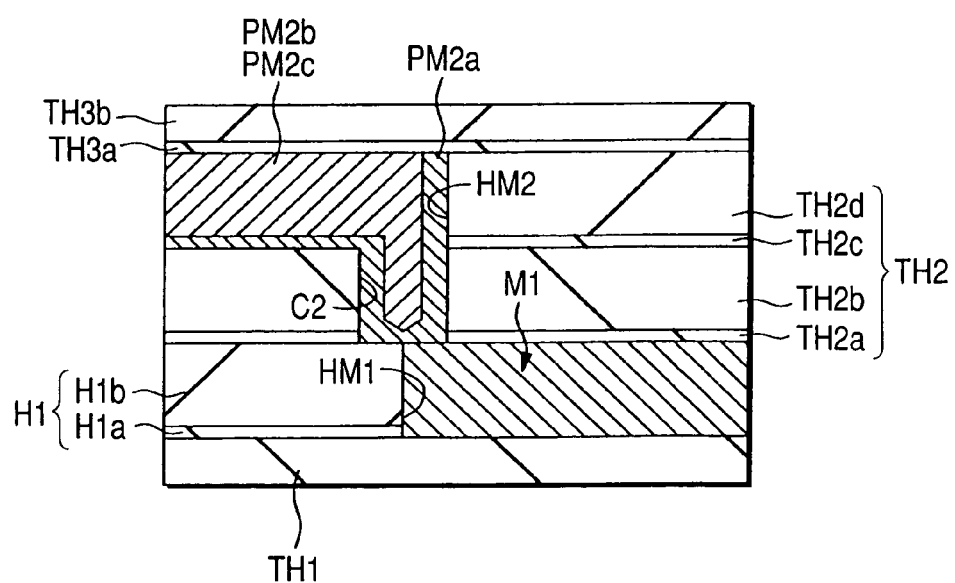
FIG. 9 is a fragmentary cross-sectional view of a substrate of the semiconductor integrated circuit device for showing the effects of the Embodiment 1 of the present invention.

The film thickness B or the film thickness D, which is a film thickness of the barrier film at the upper portion of each of the sidewalls of the contact hole C2, is formed to be at least the minimum thickness permitting maintenance of barrier properties. Below the barrier film PM2a on the bottom of the contact hole C2, the first-level interconnect M1 is formed, so that the barrier film PM2a at such a position is not always required to have a film thickness large enough to maintain barrier properties. As illustrated in FIG. 9, however, sometimes misalignment occurs between the first-level interconnect M1 and the contact hole C2 due to mask misalignment. The film thickness B is therefore desirably adjusted to at least the minimum film thickness permitting maintenance of barrier properties. In FIG. 9, PM2b and PM2c are copper films (their boundary is not illustrated in the drawing) over the barrier film PM2a. TH3a and TH3b are insulating films over the copper films (PM2b,PM2c).

Figure 10:
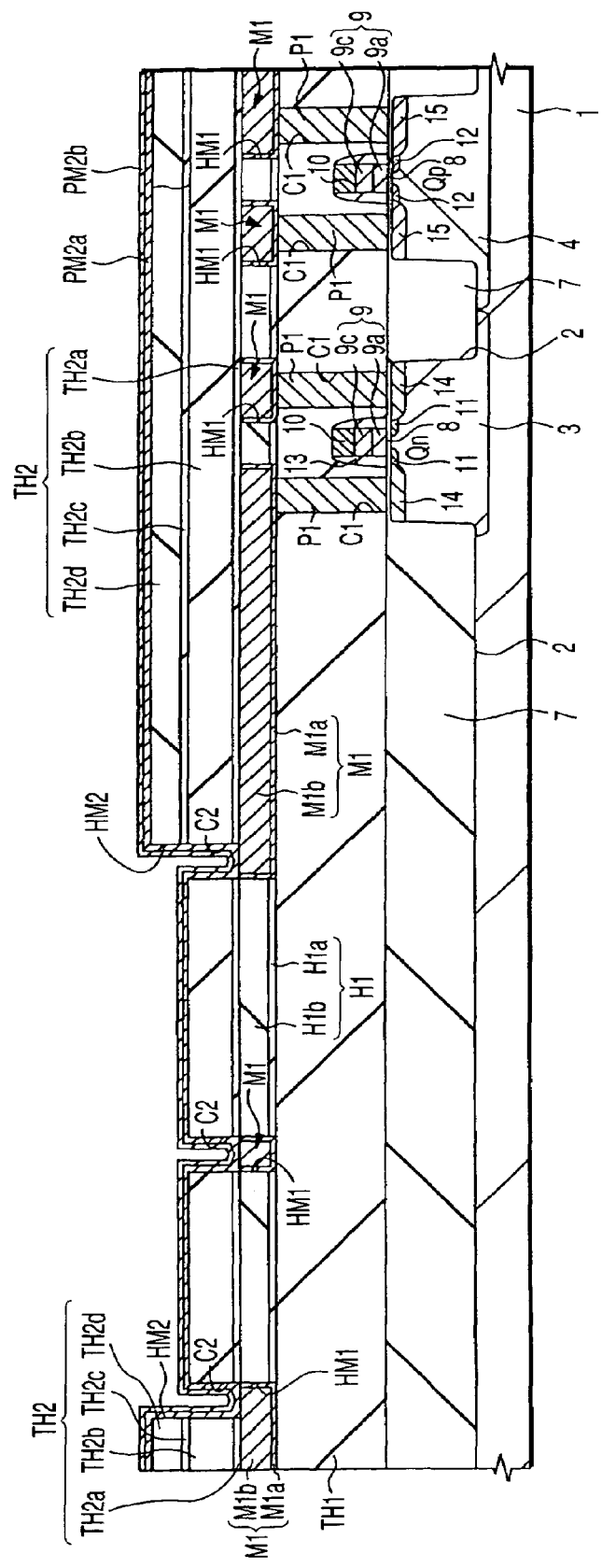
FIG. 10 is a fragmentary cross-sectional view of a substrate illustrating the manufacturing method of the semiconductor integrated circuit device according to Embodiment 1 of the present invention.

As illustrated in FIG. 10, after formation of a copper film PM2b, to serve as a seed film for electroplating, over the barrier film PM2a by sputtering or CVD, a copper film PM2c is formed, to serve as a conductive film, over the copper film PM2b by electroplating.

Figure 11:
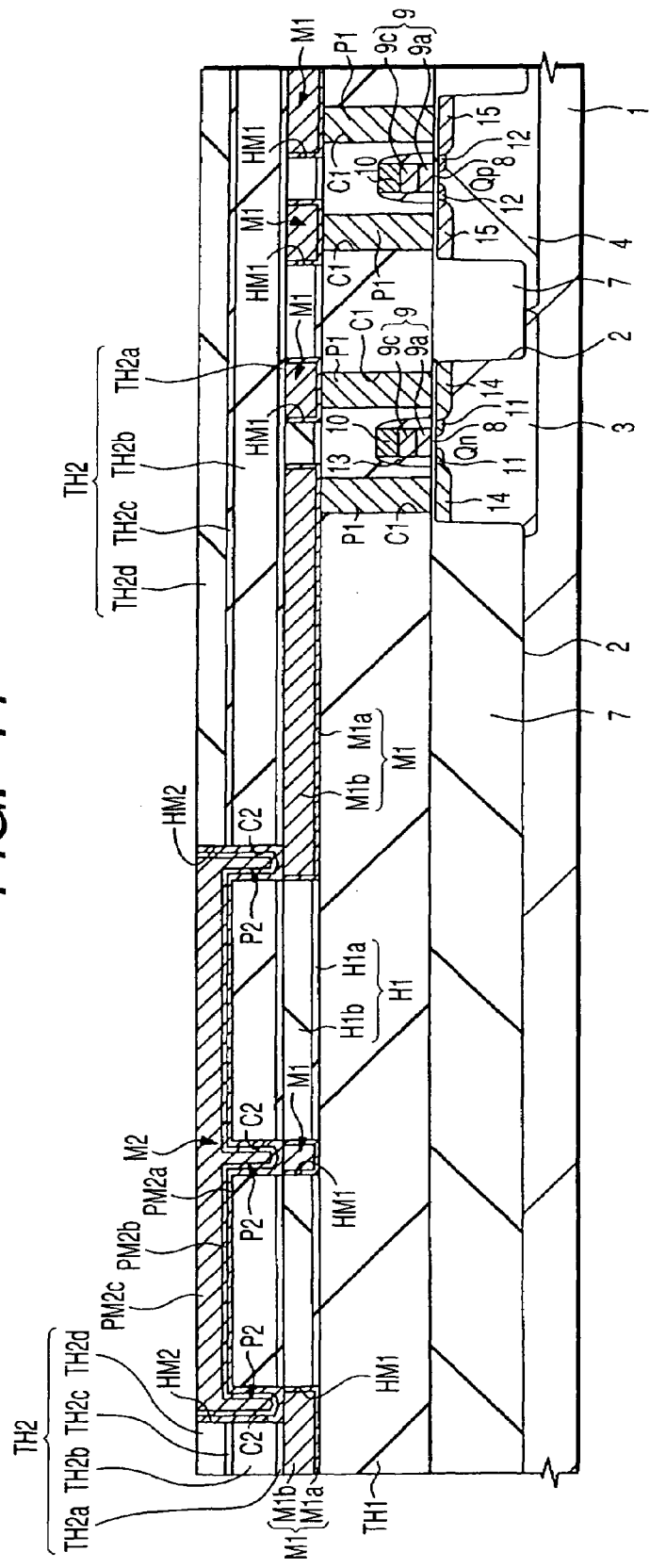
FIG. 11 is a fragmentary cross-sectional view of a substrate illustrating the manufacturing method of the semiconductor integrated circuit device according to Embodiment 1 of the present invention.
Figure 12:
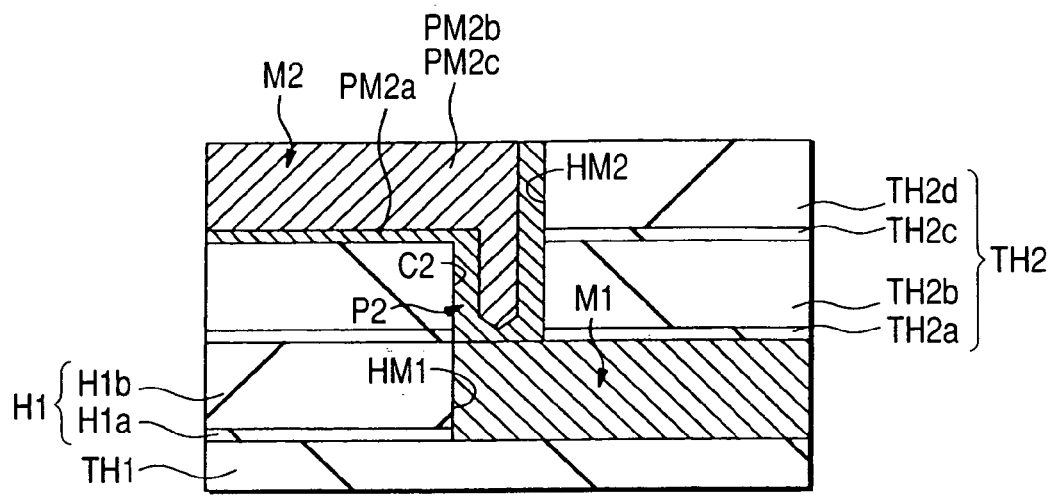
FIG. 12 is a fragmentary cross-sectional view of a substrate illustrating the manufacturing method of the semiconductor integrated circuit device according to Embodiment 1 of the present invention.
Figure 13:
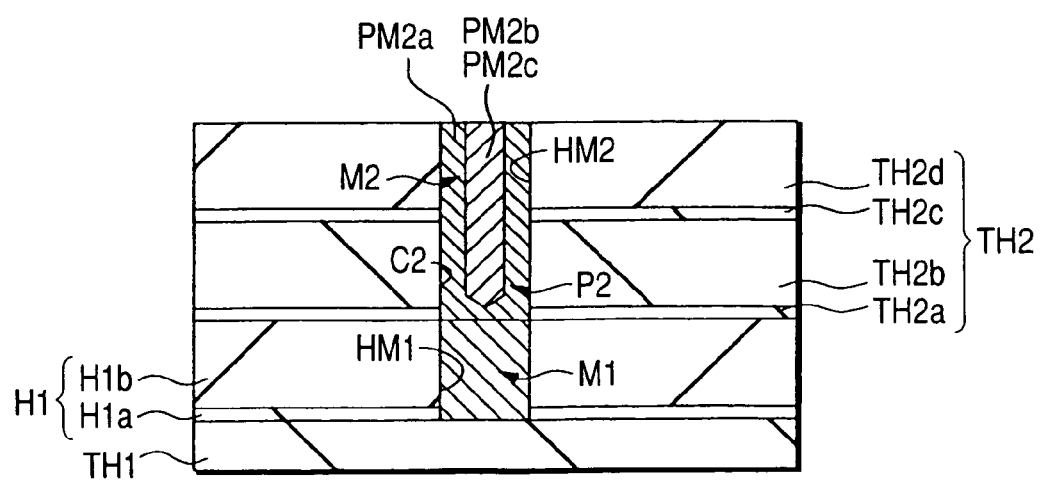
FIG. 13 is a fragmentary cross-sectional view of a substrate illustrating the manufacturing method of the semiconductor integrated circuit device according to Embodiment 1 of the present invention.

After heat treatment of the copper films PM2b and PM2c, the copper films PM2b, PM2c and barrier film PM2a outside the interconnect trench HM2 and the contact hole C2 are removed by CMP to form a second-level interconnect M2 and a connector portion (plug) P2 between the first-level interconnect, and the second-level interconnect as illustrated in FIG. 11. FIGS. 12 and 13 are enlarged views of the vicinity of the contact hole C2 in FIG. 11. FIGS. 12 and 13 correspond to the A-A cross-sectional view and B-B cross-sectional view in FIG. 6, respectively.

The essential points in the structure of the second-level interconnect M2, connector portion (plug) P2 and first-level interconnect M1 will be described briefly.

The second-level interconnect M2 and connector portion (plug) P2 are each made of the copper films PM2b, PM2c and barrier film PM2a. As illustrated in FIG. 12, the second-level interconnect M2 extends to the left side, starting from the connector portion (plug) 2, while the first-level interconnect M1 extends to the right side, starting from the connector portion (plug) P2.

Figure 14:
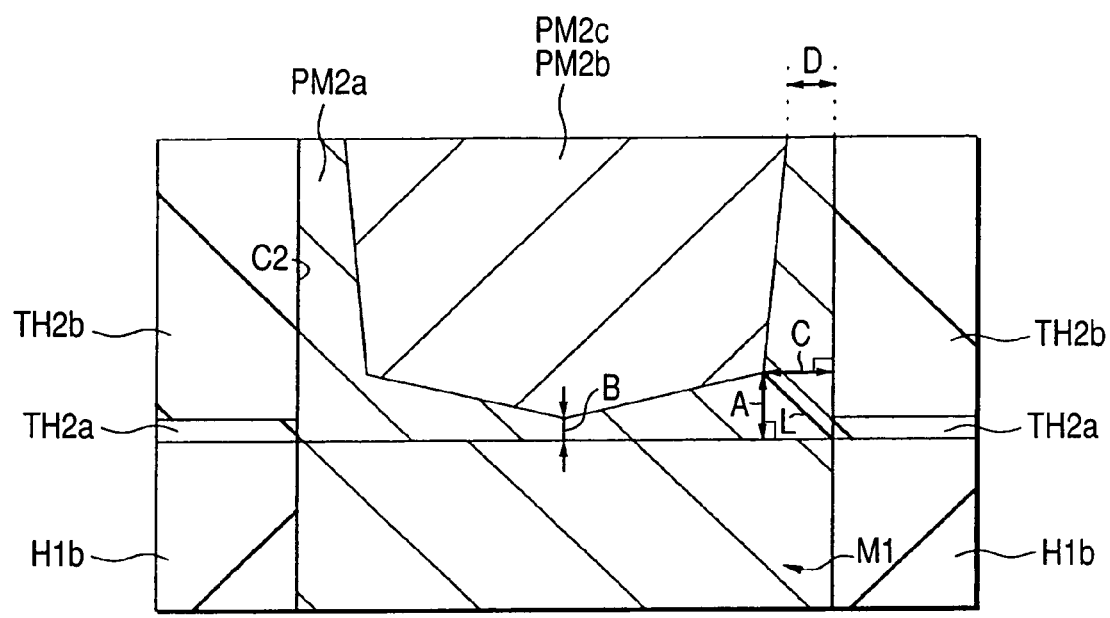
FIG. 14 is a fragmentary cross-sectional view of a substrate illustrating the manufacturing method of the semiconductor integrated circuit device according to Embodiment 1 of the present invention.

As described above, the barrier film PM2a on the bottom of the contact hole C2 increases in thickness from the center of the bottom toward the sidewalls. In other words, the barrier film PM2a has a portion which declines towards the center of the bottom from the sidewalls of the contact hole C2. As illustrated in FIG. 14, which is a partially enlarged view of the bottom of the contact hole C2 shown in FIG. 13, the film thickness B of the barrier film PM2a on the center of the bottom of the contact hole C2 is smaller than the film thickness A, which is the film thickness, at the end portion in the direction of the sidewalls, on the bottom of the contact hole C2 (A≧B). The film thickness A can be determined, for example, by dropping a perpendicular line toward the bottom of the contact hole C2 from the end of the shortest distance L between from the corner of the bottom of the contact hole C2 to the surface of the barrier film PM2a.

Figure 15:
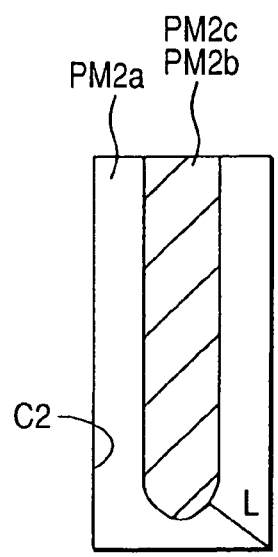
FIG. 15 is a fragmentary cross-sectional view of a substrate illustrating the manufacturing method of the semiconductor integrated circuit device according to Embodiment 1 of the present invention.

The actual surface of the barrier film, as illustrated in FIG. 15, is curved at the corner of the bottom of the contact hole C2. When the contact hole C2 has a curved corner, the above-described shortest distance L can be determined by using, as a starting point, the intersection between the extension of the side line of the contact hole C2 and the extension of the bottom line.

Figure 17:
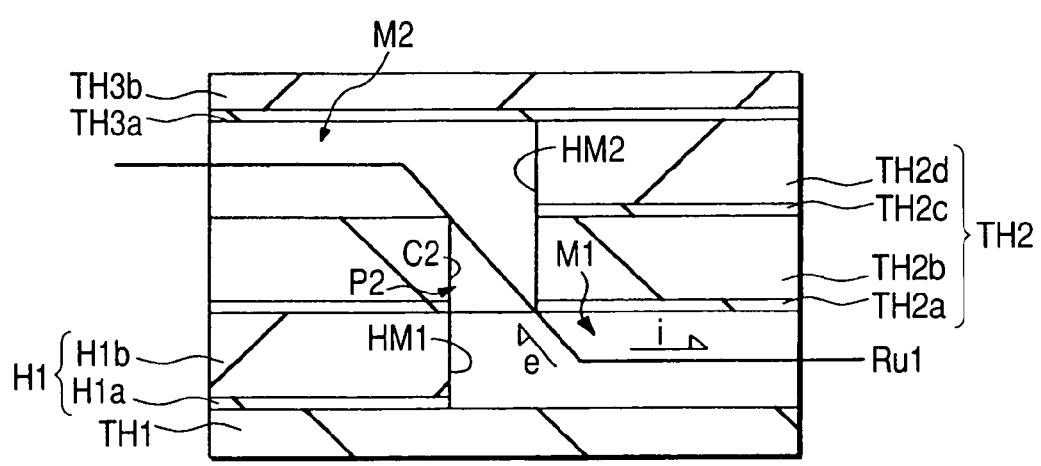
FIG. 17 is a fragmentary cross-sectional view of a substrate of the semiconductor integrated circuit device illustrating the effect of Embodiment 1 of the present invention.
Figure 18:
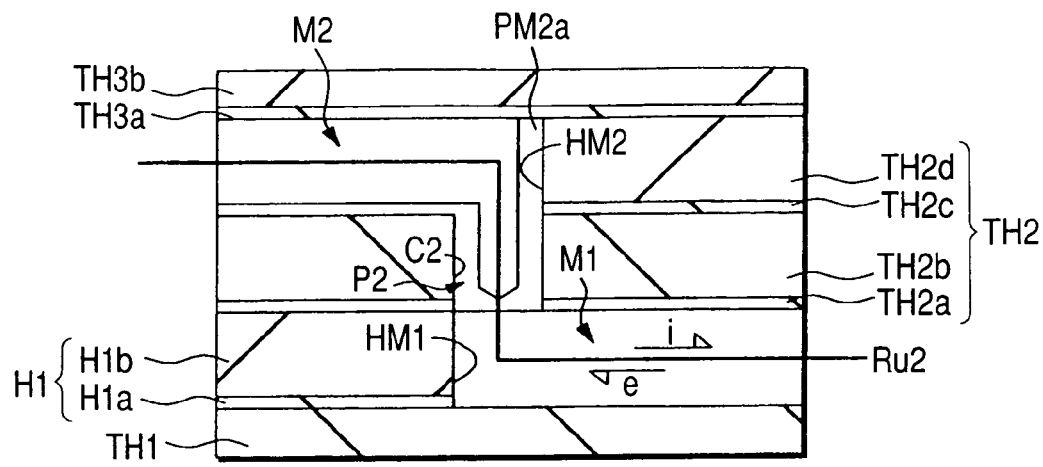
FIG. 18 is a fragmentary cross-sectional view of a substrate of the semiconductor integrated circuit device illustrating the effect of Embodiment 1 of the present invention.

In the case where electric current (i) flows from the second-level interconnect M2 to the first-level interconnect M1 via such a connector portion (plug) P2, electrons (e) flow, as illustrated in FIG. 17, through a route Ru1, which extends from the lower right to the upper left of the connector portion (plug) P2, because this route becomes the geometrically shortest route. Electrons (e) flow, as illustrated in FIG. 18, toward the first-level interconnect M1 via the center of the connector portion (plug) P2, because the electrical resistance of a thin portion of the barrier film PM2a becomes lowest.

According to this Embodiment, the geometrically shortest route (route Ru1) of electric current from the second-level interconnect M2 to the first-level interconnect M1 does not coincide with a thin portion of the barrier film PM2a at which the electrical resistance becomes lowest, so that a current route can be dispersed. Accordingly, a concentration of electrons (e) does not occur easily, making it possible to improve the electromigration properties.

Figure 19:
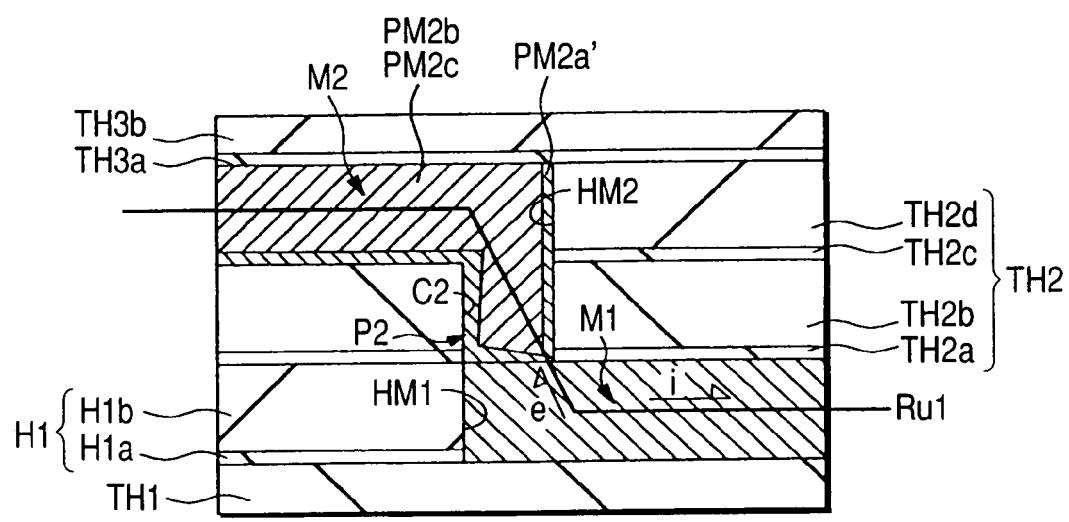
FIG. 19 is a fragmentary cross-sectional view of a substrate of the semiconductor integrated circuit device illustrating the effect of Embodiment 1 of the present invention.
Figure 20A:
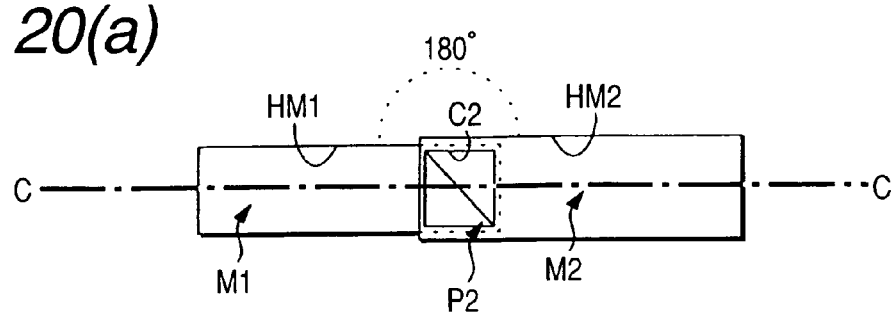
FIG. 20($a$) is a fragmentary plan view of a substrate illustrating the manufacturing method of the semiconductor integrated circuit device according to Embodiment 1 of the present invention, and FIG. 20($b$) is its fragmentary cross-sectional view.
Figure 20B:
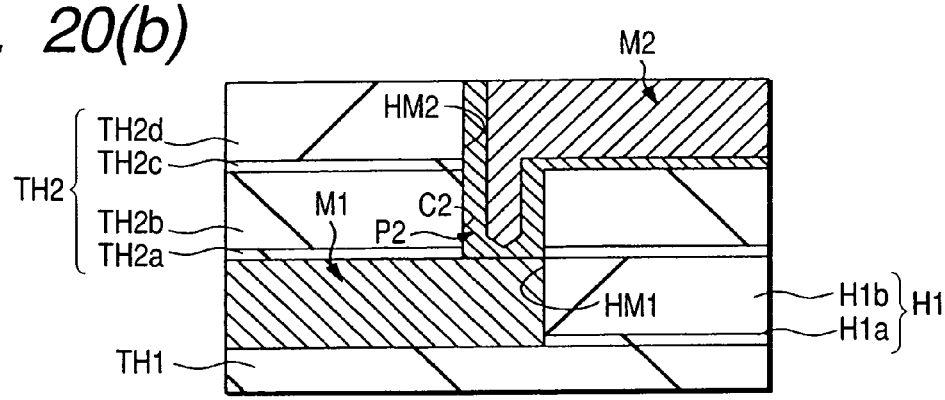
Figure 21A:
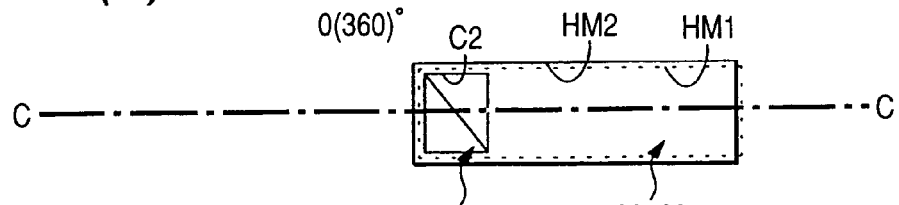
FIG. 21($a$) is a fragmentary plan view of a substrate illustrating the manufacturing method of the semiconductor integrated circuit device according to Embodiment 1 of the present invention, and FIG. 21($b$) is its fragmentary cross-sectional view.
Figure 21B:
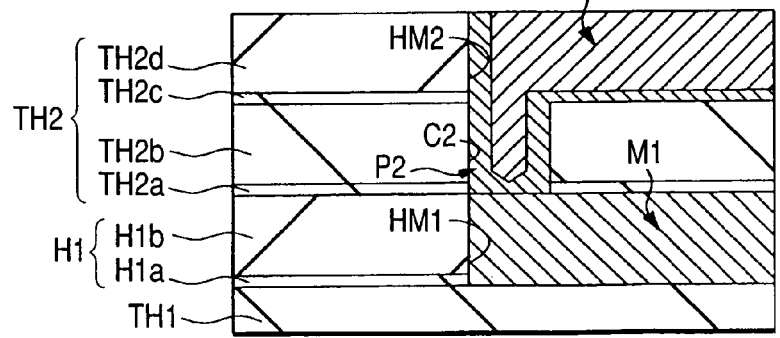
Figure 22A:
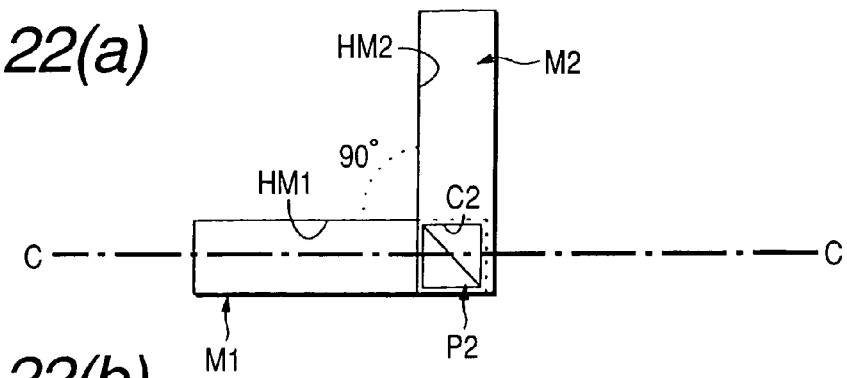
FIG. 22($a$) is a fragmentary plan view of a substrate illustrating the manufacturing method of the semiconductor integrated circuit device according to Embodiment 1 of the present invention, and FIG. 22($b$) is its fragmentary cross-sectional view.
Figure 22B:
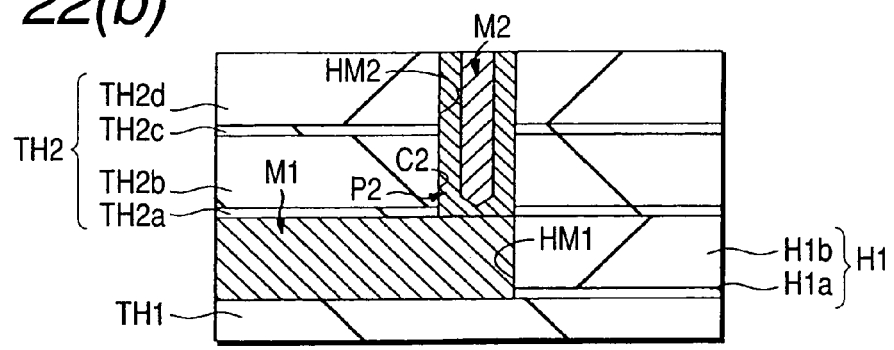
Figure 23A:
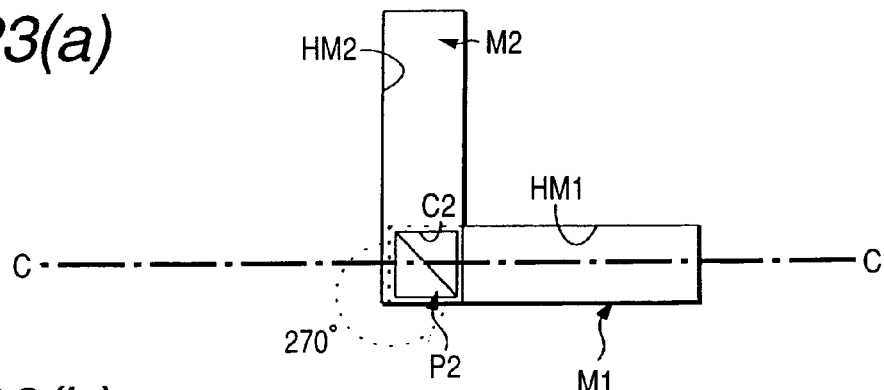
FIG. 23($a$) is a fragmentary plan view of a substrate illustrating the manufacturing method of the semiconductor integrated circuit device according to Embodiment 1 of the present invention, and FIG. 23($b$) is its fragmentary cross-sectional view.
Figure 23B:
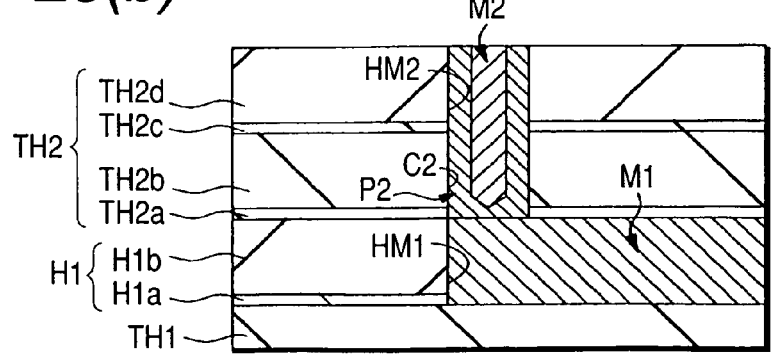

As illustrated in FIG. 19, upon formation of the barrier film PM2a', variations in film thickness appear inside of the contact hole C2. Variations are particularly large when the film is formed by sputtering, because the manner in which sputter particles (Ti particles, in this case) that are scattered from a target enter the contact holes C2 differs, depending on the position of the contact hole on the wafer.

When the contact hole exists on the left edge of the wafer, the barrier film PM2a' is formed so as to be thick on the left sidewall of the contact hole C2 and is formed so as to be thin on its right sidewall as illustrated in FIG. 19. On the bottom of the contact hole C2, the film thickness exhibits a gradual decrease from the left side toward the right side. Since, in the contact hole on the left end of the wafer, sputter particles coming from the right direction enter more easily than those coming from the left direction, the barrier film PM2a' is formed so as to be thick on the left sidewall or left side of the bottom opposite to the direction of movement of the sputter particles. When the contact hole exists on the right end of the wafer, on the other hand, the barrier film is formed so as to be thick on the right sidewall or right side of the bottom of the contact hole (refer to FIG. 1(a) of the above-described NIKKEI MICRODEVICES, p. 65(July 2000)).

When an electric current flows from the second-level interconnect M2 to the first-level interconnect M1 through the connector portion (plug) P2, as illustrated in FIG. 19, a pathway via the route Ru1 extending from the upper left toward the lower right of the connector portion (plug) P2 becomes the geometrically shortest route. At the same time, a thin portion of the barrier film exists in the lower right of the connector portion (plug) P2. A concentration of electrons (e) therefore occurs at such a portion. Electrons which pass through the above-described portion attract copper atoms constituting a copper film; and, with this portion as a starting point, peeling occurs at the interface between the copper films (PM2b, PM2c) and the barrier film PM2a'. If the electric current is continuously passed, the transfer of copper becomes large, thereby forming a void, which becomes a cause of disconnection. Such a phenomenon involving the transfer of metal atoms by momentum exchange between electrons flowing through a conductor and metal ions is called electromigration.

As described above, when the barrier film PM2a' has a shape as illustrated in FIG. 19, the geometrically shortest route Ru1 of electric current crosses over a thin portion (a portion whose electrical resistance becomes lowest) of the barrier film, causing a deterioration in the electromigration properties.

In this Embodiment, on the other hand, the barrier film PM2a on the bottom of the contact hole C2 is formed to have a thickness increasing from the center of the bottom toward the sidewalls. The geometrically shortest route Ru1 of electric current, therefore, does not cross over a thin portion (a portion whose electrical resistance becomes lowest) of the barrier film, thereby preventing a concentration of electrons to this portion. As a result, improvement in electromigration properties can be attained.

In this Embodiment, as illustrated in FIGS. 12 and 13, the barrier film PM2a on the bottom of the contact hole C2 is formed to have a thickness increasing from the center of the bottom toward the sidewalls, all around the bottom of the contact hole C2, so that the above-described effect is available even if the first-level interconnect M1 extends in any direction relative to the second-level interconnect M2.

More specifically, as illustrated in FIGS. 20(a) to 23(b), the first-level interconnect M1 and the second-level interconnect M2 form various angles. For example, FIGS. 20(a), 21(a), 22(a) and 23(a) illustrate the cases where the angles formed between them are 180°, 0(360)°, 90°, and 270°, respectively. Each of FIGS. 20(a), 21(a), 22(a) and 23(a) illustrate the relationship between the pattern of the first-level interconnect M1 and the pattern of the second-level interconnect M2.

Figure 24A:
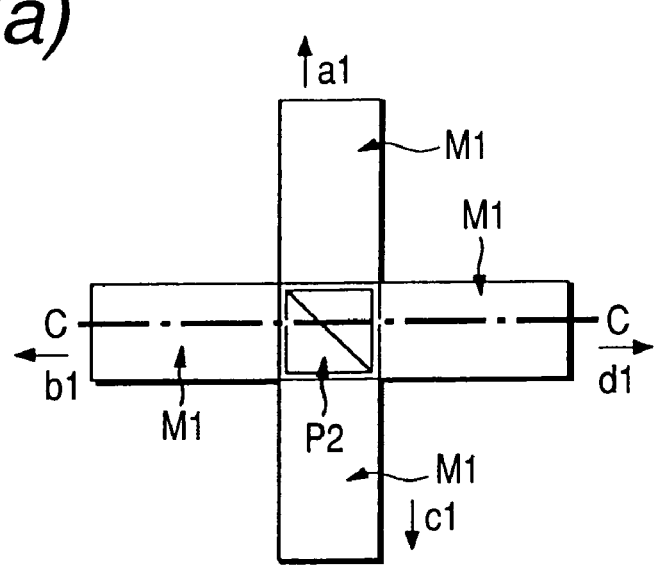
FIG. 24($a$) is a fragmentary plan view of a substrate of the semiconductor integrated circuit device illustrating the effect of Embodiment 1 of the present invention, and FIG. 24($b$) is its fragmentary cross-sectional view.
Figure 24B:
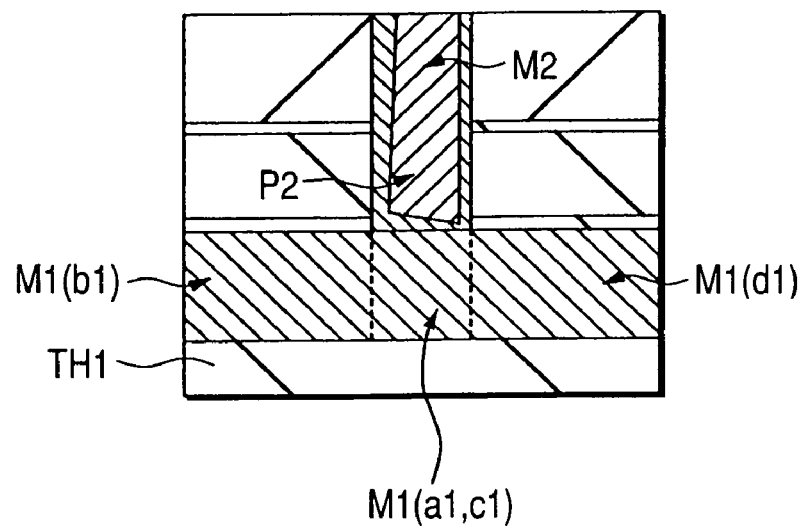

An increase in the thickness of the barrier film PM2a from the center of the bottom toward the sidewalls, all around the bottom of the contact hole C2, as in this Embodiment, makes it possible to improve the electromigration properties as illustrated in FIGS. 20(a) to 23(b) irrespective of the angle formed between the pattern of the first-level interconnect M1 and the pattern of the second-level interconnect M2. Of course, the angle formed between the pattern of the first-level interconnect M1 and the pattern of the second-level interconnect M2 is not limited to the angles shown in FIGS. 20(a) to 23(b). Even when the pattern of the first-level interconnect M1 and the pattern of the second-level interconnect M2 cross diagonally, a improvement can be achieved. When the barrier film PM2a is formed so as to be thick only on the left side of the contact hole C2, as illustrated in FIG. 19, on the other hand, a deterioration in the electromigration properties occurs, in among extending directions of the first-level interconnects (a1) to (d1), in directions (a1,c1,d1) other than the left direction (b1). For facilitating an understanding of the effect of this Embodiment, FIG. 24(a) is a plan view illustrating the pattern of the first-level interconnect M1 and FIG. 24(b) is a cross-sectional view taken along a line C-C in FIG. 24(a).

Figure 25A:
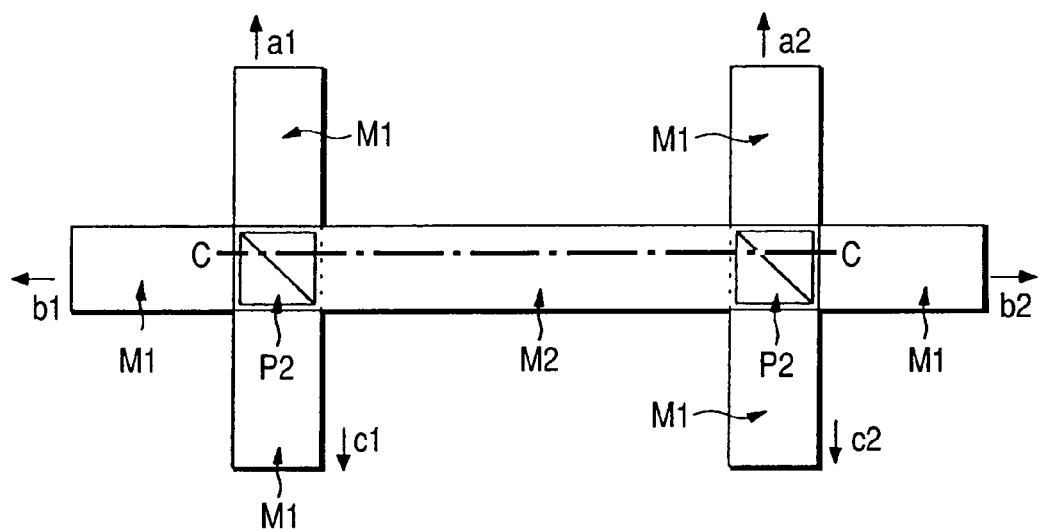
FIG. 25($a$) is a fragmentary plan view of a substrate illustrating the semiconductor integrated circuit device according to Embodiment 1 of the present invention, and FIG. 25($b$) is its fragmentary cross-sectional view.
Figure 25B:
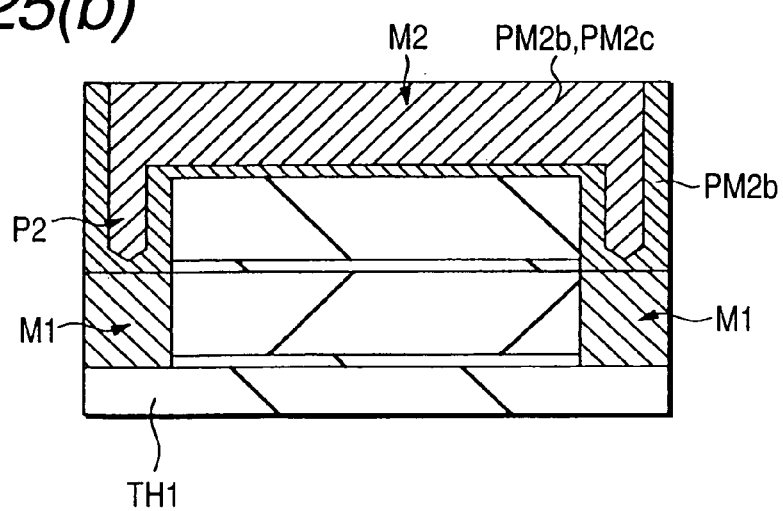

According to this Embodiment, as illustrated in FIG. 25(a) and FIG. 25(b), even in the case where two interlevel interconnects M1 extend in the directions (a1) and (b1) or (c1), and (a2) and (b2) or (c2), respectively, relative to the second-level interconnect M2, the above-described effect is available because the film thickness is increased from the center of the bottom toward the sidewalls all around the bottom of the contact hole C2. FIGS. 25(a) and 25(b) are provided for facilitating an understanding of the effect of this Embodiment. FIG. 25(a) is a plan view illustrating the relationship between the pattern of the first-level interconnect M1 and the pattern of the second-level interconnect M2, while FIG. 25(b) is a cross-sectional view taken along a line C-C in FIG. 25(a).

Figure 26:
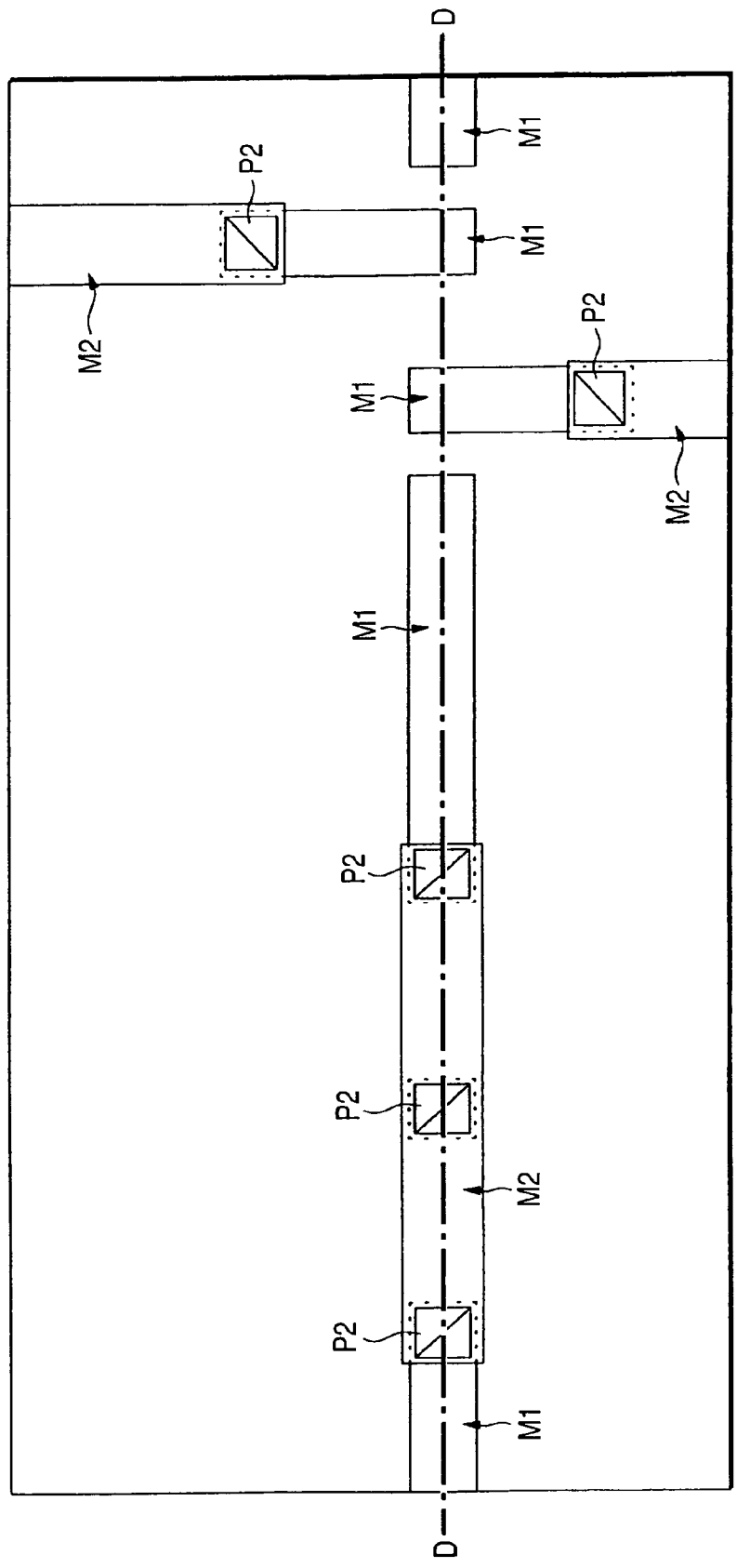
FIG. 26 is a fragmentary plan view of a substrate illustrating the manufacturing method of the semiconductor integrated circuit device according to Embodiment 1 of the present invention.

Even when the second-level interconnect M2 is disposed as illustrated in FIG. 26 relative to a plurality of the first-level interconnects M1, that are connected with the $n^+$ type semiconductor regions 14 (source, drain) and the $p^+$ type semiconductor regions 15 (source, drain) via plugs P1, as illustrated in FIG. 11, the electromigration properties can be improved. For example, FIG. 11 corresponds to a cross-section taken along a line D-D in FIG. 26.

As described above, the film thickness C of the barrier film PM2a on the bottom of the sidewalls of the contact hole C2 is greater than the film thickness B at the center of the bottom (Refer to FIGS. 8 and 14). This film thickness C is determined, for example, by dropping a perpendicular line from the end portion of the shortest distance L, which extends from the bottom corner of the contact hole C2 toward the surface of the barrier film PM2a, to the sidewalls of the contact hole C2.

Figure 16:
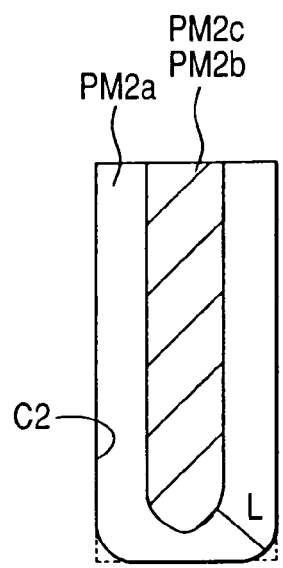
FIG. 16 is a fragmentary cross-sectional view of a substrate illustrating the manufacturing method of the semiconductor integrated circuit device according to Embodiment 1 of the present invention.

The actual surface of the barrier film, as illustrated in FIG. 15, is curved at the corner of the bottom of the contact hole C2. As illustrated in FIG. 16, when the corner of the contact hole C2 is curved, the above-described shortest distance L can be determined by using, as a starting point, an intersection of the extended side line of the contact hole C2 with the extended bottom line.

By setting the film thickness C so that it is greater than the film thickness B, a concentration of electrons can be prevented even if overetching not greater than the film thickness A is conducted upon formation of the contact hole C2. This effect will be described in detail in the description of Embodiment 3, so that further description is omitted here.

Next, one example of the formation of the barrier film PM2a and a method of controlling the film thicknesses A and B will be described.

Figure 27:
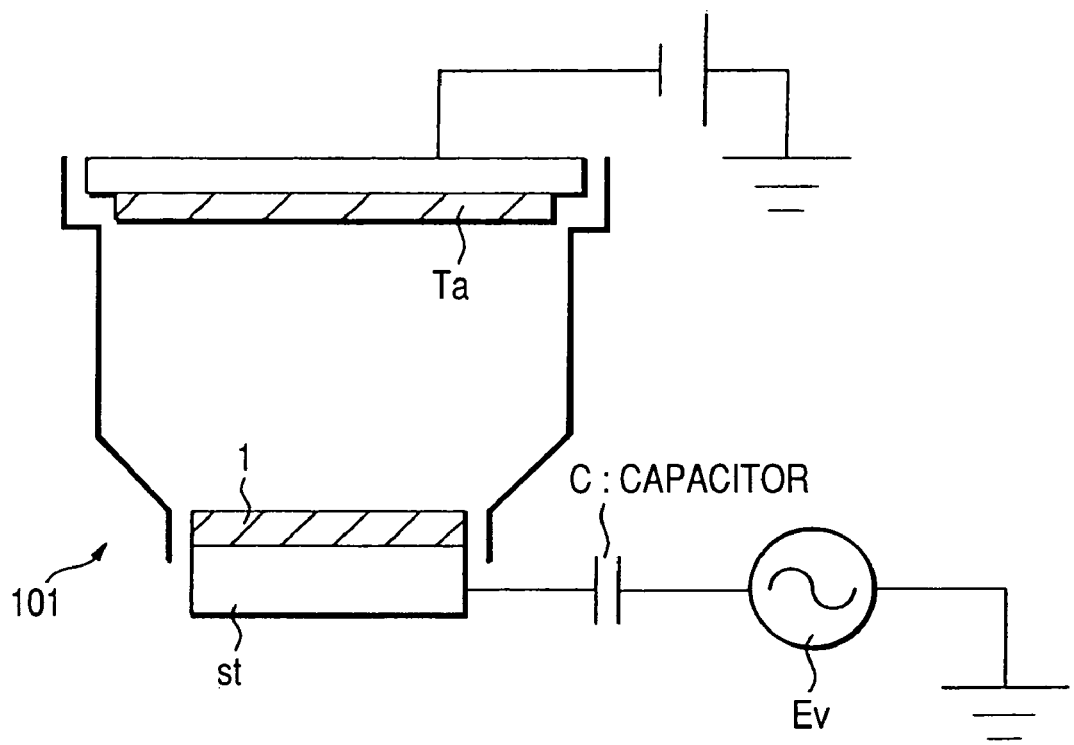
FIG. 27 is a schematic view illustrating an apparatus used for manufacturing the semiconductor integrated circuit device according to Embodiment 1 of the present invention.

FIG. 27 is a schematic view of an ion bias sputtering apparatus 101 of the type used for the formation of the barrier film PM2a. As illustrated in FIG. 27, a substrate 1 (wafer) having a contact hole C2 formed therein, which substrate is illustrated in FIG. 3, is held by a supporter St, and alternating voltage Ev is applied (biased). Above the wafer, a target Ta (in this case, a plate made of Ti) exists. Upon formation of the barrier film, the apparatus is placed under a pressure-reduced condition, and upon film formation, a gas for producing a discharge, such as argon (Ar) is injected into the apparatus. When a voltage is applied in this argon atmosphere, a glow discharge occurs, and the target Ta of the cathode is bombarded with ions in the plasma so as to displace sputter particles (in this case, Ti particles). These displaced particles are deposited in the contact hole on the surface of the wafer, whereby a barrier film is formed.

Figure 28:
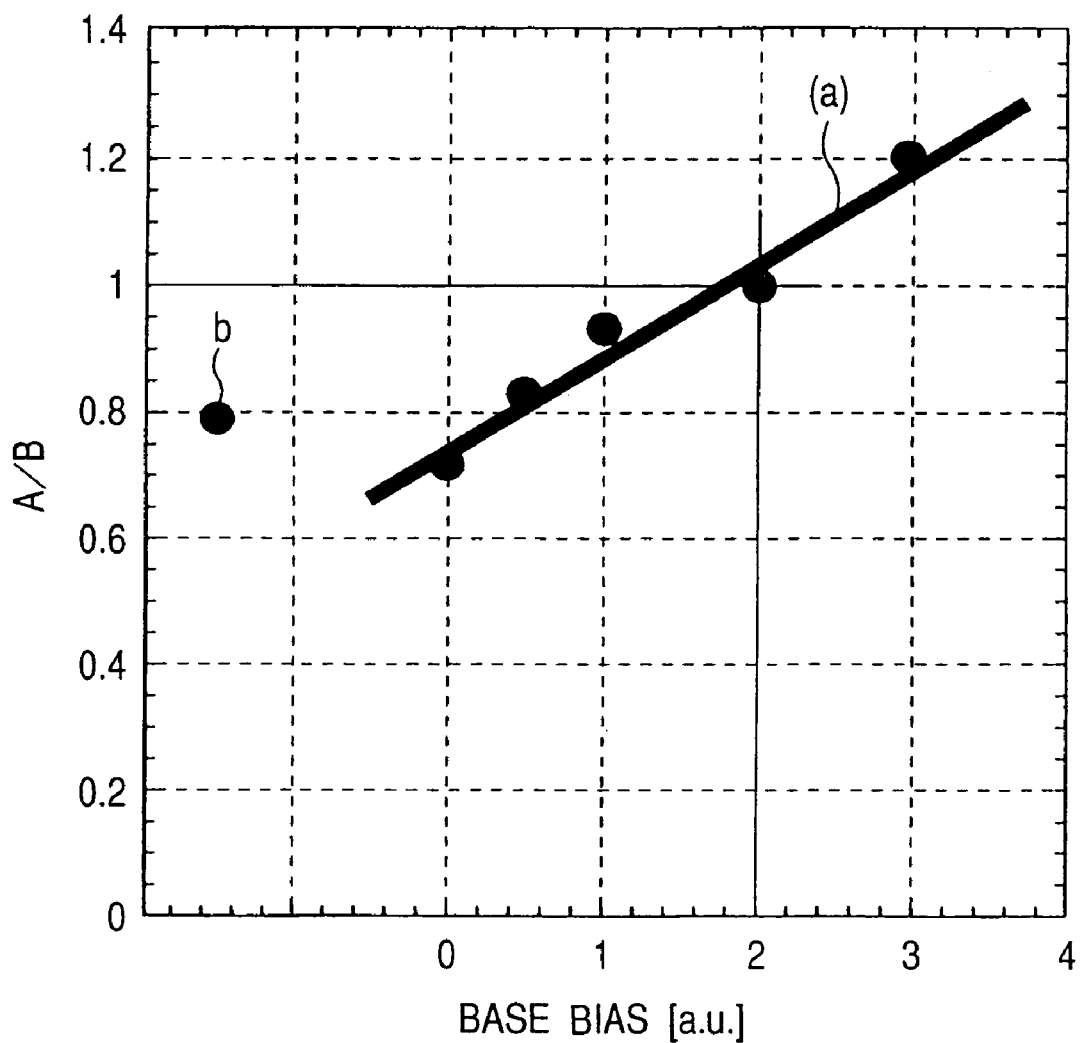
FIG. 28 is a graph showing an effect of Embodiment 1 of the present invention.

FIG. 28 is a graph showing the ratio (A/B) of the film thickness A to the film thickness B when the substrate bias [a.u.] to be applied to the substrate 1 is changed. As illustrated by the line (a) of FIG. 28, the greater the substrate bias, the greater will be the film thickness ratio (A/B). When the substrate bias is 2 or greater, the film thickness ratio (A/B) becomes 1 or greater, in other words, A≧B. The point B represents a film thickness ratio (A/B) when the film is formed by ordinarily employed magnetron sputtering.

Upon film formation, it is preferred that the deposition rate is 50 nm/min, the film forming pressure is 0.1 Pa or less, and the film forming temperature falls within a range of from room temperature to 400° C. FIG. 28 is a graph showing the film thickness ratio when the width of the interconnect trench HM2 is 0.18 μm and the aspect ratio of the contact hole C2 (sum of the interconnect depth and the depth of the connector portion/diameter of the connector portion) is 2.8.

Thus, by controlling the substrate bias, the film thickness ratio (A/B) can be controlled and conditions permitting adjustment of the film thickness ratio (A/B) to 1 or greater, as described in this Embodiment, can be selected. The conditions permitting adjustment of the film thickness ratio (A/B) to 1 or greater vary, depending on the size of the interconnect or connecting hole.

Figure 29:
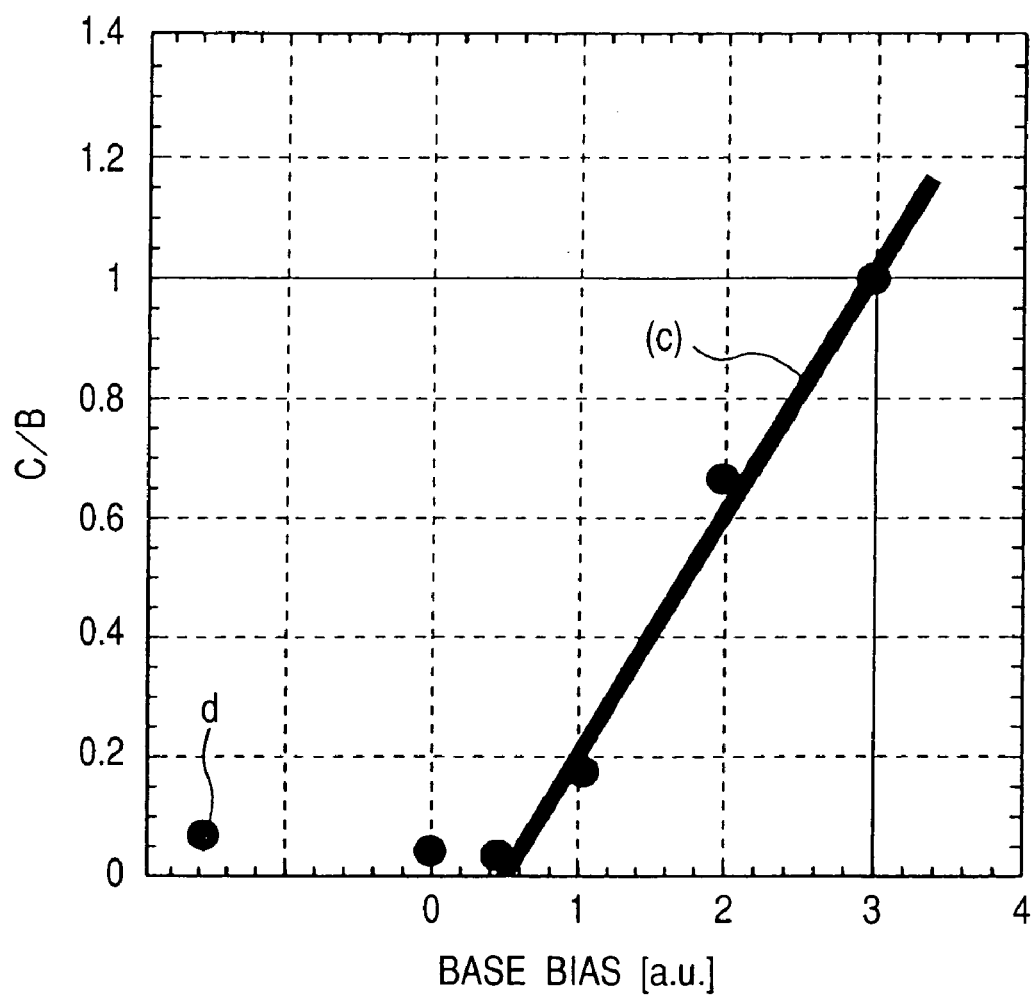
FIG. 29 is a graph showing another effect of Embodiment 1 of the present invention.

FIG. 29 is a graph which shows a ratio (C/B) of the film thickness C to the film thickness B when the substrate bias [a.u.] to be applied to the substrate 1 is changed. As illustrated in FIG. 29 by the line (c), the greater the bias, the greater will be the film thickness ratio (C/B). When the bias is about 3 or greater, the film thickness ratio (C/B) becomes 1 or greater, that is, C≧B. The point d represents a film thickness ratio (C/B) when the film is formed using ordinarily employed magnetron sputtering.

In order to satisfy both A≧B and C≧B, film formation must be carried out at a substrate bias of 3 or greater.

Figure 30:
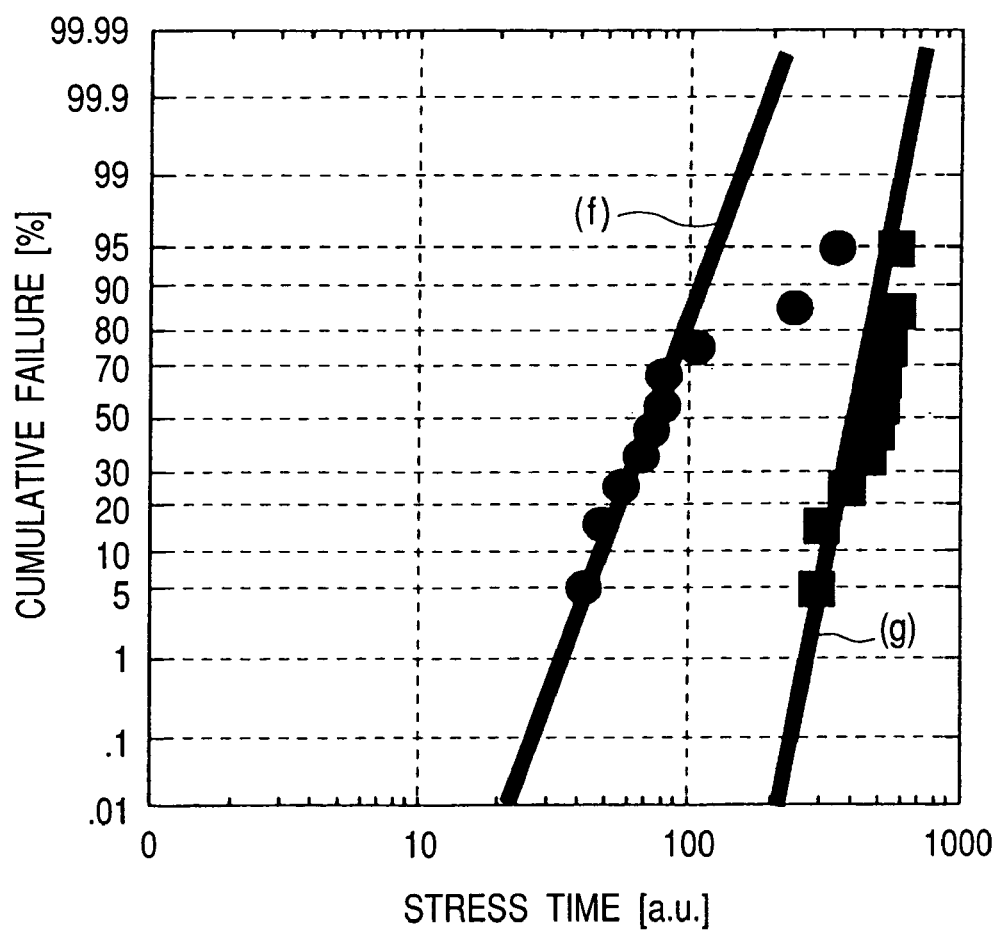
FIG. 30 is a graph showing a further effect of Embodiment 1 of the present invention.

FIG. 30 is a graph showing the relationship between a cumulative failure [%] and stress time [a.u.] of a semiconductor integrated circuit device when a barrier film is formed using ordinarily employed magnetron sputtering under the conditions of A≦B and C≦B and when the film is formed under the conditions of A≧B and C≧B in accordance with this Embodiment. The line (f) shows the former case of using ordinarily employed magnetron sputtering, where A≦B and C≦B, while the line (g) shows the latter case of using the present invention, where A≧B and C≧B. The term "stress time" as used herein means the time during which the semiconductor integrated circuit device is exposed to extreme conditions, such as high temperature. As illustrated in FIG. 30, a single digit improvement in the electromigration life can be attained by the constitution according to this Embodiment.

Next, steps for forming upper-level interconnects (third to fifth-level interconnects) over the second-level interconnect M2 will be described.

Figure 31:
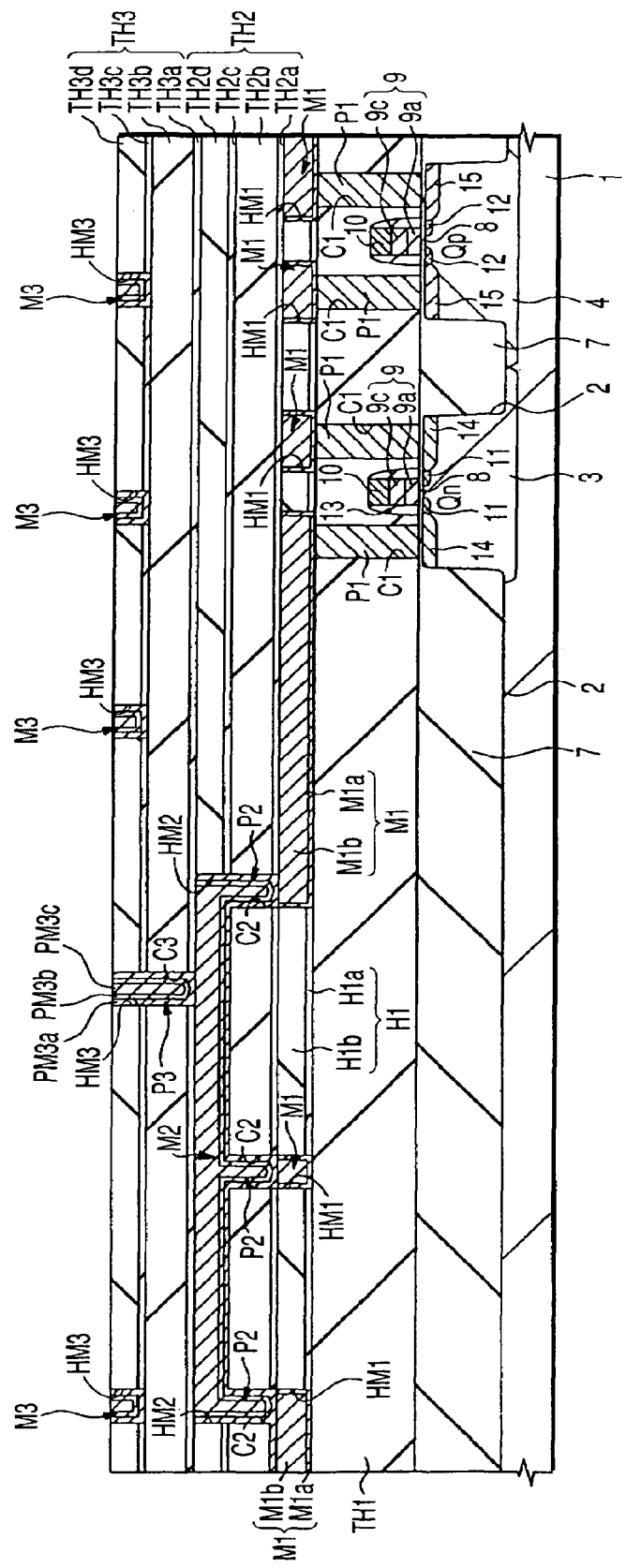
FIG. 31 is a fragmentary cross-sectional view of a substrate illustrating the manufacturing method of the semiconductor integrated circuit device according to Embodiment 1 of the present invention.

As illustrated in FIG. 31, an interlayer insulating film TH3 (silicon nitride film TH3$a$, silicon oxide film TH3$b$, silicon nitride film TH3$c$ and silicon oxide film TH3$d$) is formed over the second-level interconnect M2 in a similar manner to that employed for the formation of the interlayer insulating film TH2, and an interconnect trench HM3 and contact hole C3 are formed in a similar manner to that employed for the formation of the interconnect trench HM2 and contact hole C2. Then, as in the barrier film PM2$a$, and copper films PM2$g$ and PM2$c$, a barrier film PM3$a$ and copper films PM3$b$ and PM3$c$ are formed, followed by polishing by CMP after heat treatment, whereby a third-level interconnect M and a connector portion (plug) P3 between the second-level interconnect and the third-level interconnect are formed. In short, the barrier film PM3$a$ in the contact hole C3 is formed to have a structure similar to that of the barrier film PM2$a$. This means that the barrier film PM3$a$ on the bottom of the contact hole C3 is formed to have a film thickness that increases from the center of the bottom toward the sidewalls, all around the bottom of the contact hole C3.

Figure 32:
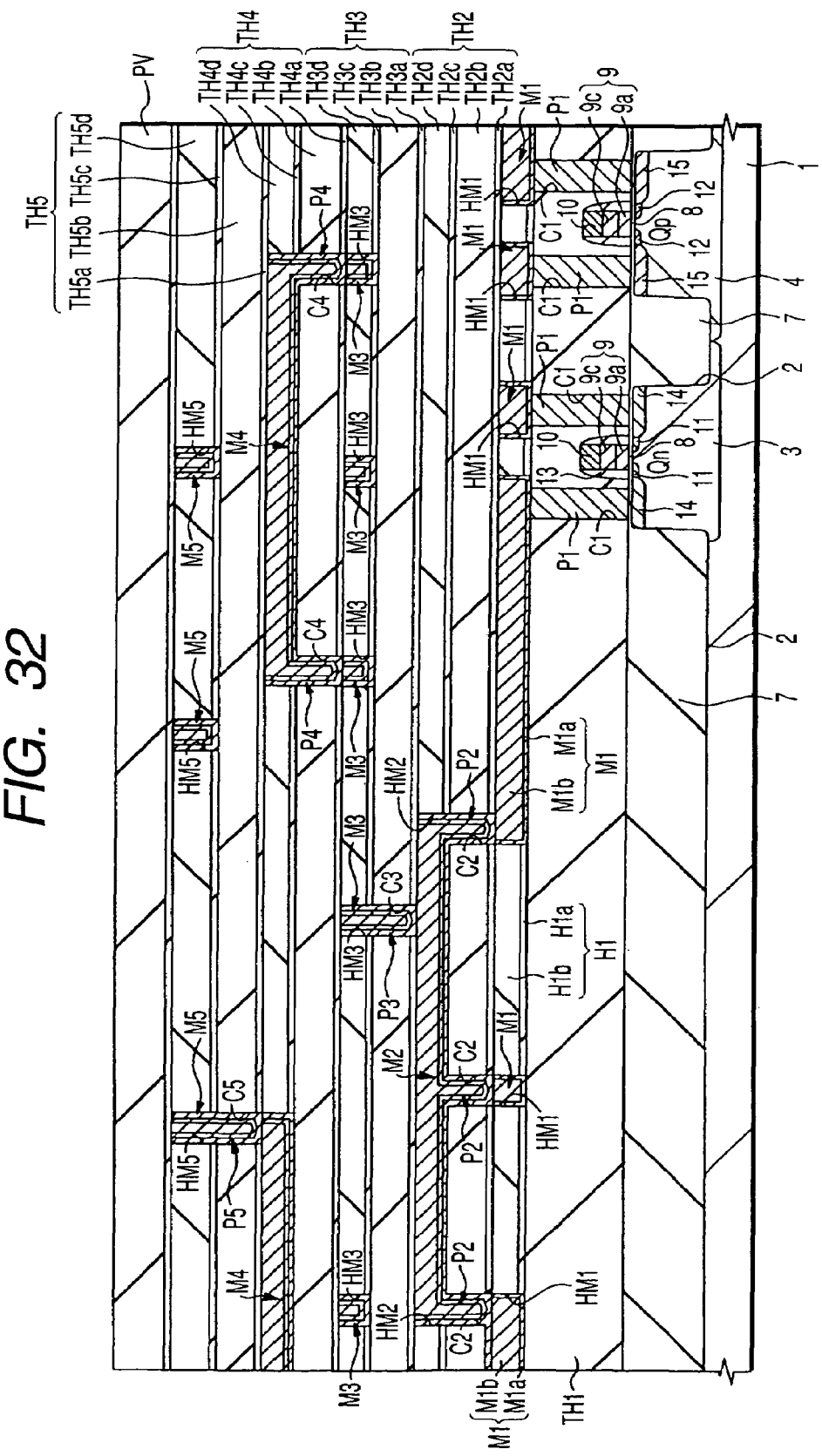
FIG. 32 is a fragmentary cross-sectional view of a substrate illustrating the manufacturing method of the semiconductor integrated circuit device according to Embodiment 1 of the present invention.

By forming interlayer insulating films TH4 and TH5, fourth-level and fifth-level interconnects M4 and M5, and connecting portions (plugs) P4 and P5 to have similar structures to the interlayer insulating film TH3, third-level interconnect M3 and connector portion (plug) P2, respectively, a five-layer interconnect is formed, as illustrated in FIG. 32. More specifically, in a contact hole C4, through which the fourth-level interconnect M4 and the third-level interconnect M3 are connected, a barrier film PM4$a$ on the bottom of the contact hole C4 is formed to have a film thickness that increases from the center of the bottom toward the sidewalls, all around the bottom of the contact hole C4. In a contact hole C5, through which the fifth-level interconnect M5 and the fourth-level interconnect M4 are connected, the barrier film PM5$a$ on the bottom of the contact hole C5 is formed to have a film thickness that increases from the center of the bottom toward the sidewalls, all around the bottom of the contact hole C5. PM4$b$ and PM5$b$ are copper films similar to PM3$b$ and PM2$b$, while PM4$c$ and PM5$c$ are copper films similar to PM3$c$ and PM2$c$.

After deposition of a silicon nitride film, to serve as a copper diffusion preventive film, over the fifth-level interconnect M5, a laminate film PV of a silicon oxide film and a silicon nitride film is deposited as a protective film.

Although no particular limitation is imposed, the second-level interconnect M2 and fourth-level interconnect M4 are formed to extend mainly in the X direction, while the third-level interconnect M3 and fifth-level interconnect M5 are formed to extend mainly in a direction orthogonal to the X direction. With the first-level interconnect M1 to the fifth-level interconnect M5, MISFETQn and MISFETQp are linked so as to constitute, for example, a logic circuit of a microprocessor.

In this Embodiment, the first-level interconnect is formed from a copper film M1$b$. As the first-level interconnect, a copper alloy (an alloy containing, in addition to copper, magnesium (Mg), silver (Ag), platinum (Pt), titanium (Ti), tantalum (Ta) or aluminum (Al)), silver or a silver alloy, gold (Au) or a gold alloy, or aluminum or an aluminum alloy (an alloy containing, in addition to aluminum, silicon (Si), copper, niobium (Nb) or titanium) may be used as a main material. In this Embodiment, the first-level interconnect is formed by the damascene method. Alternatively, after deposition of the above-described material over the interlayer insulating film TH1, it may be patterned into a desired shape by dry etching.

Embodiment 2

In Embodiment 1, the second-level interconnect M2 and connector portion (plug) 2 are formed by the dual damascene method. Alternatively, the single damascene method may be employed, as described below, to form them. A semiconductor integrated circuit device according to this Embodiment of the present invention will be described in accordance with its method of manufacture. FIGS. 33 to 42 are fragmentary cross-sectional or fragmentary plan views of a substrate illustrating the method of manufacture of a semiconductor integrated circuit device according to Embodiment 2 of the present invention. Steps up to the formation of the first-level interconnect M1 are similar to those of Embodiment 1, which was described with reference to FIGS. 1 and 2, so that a repeated description thereof is omitted.

Figure 33:
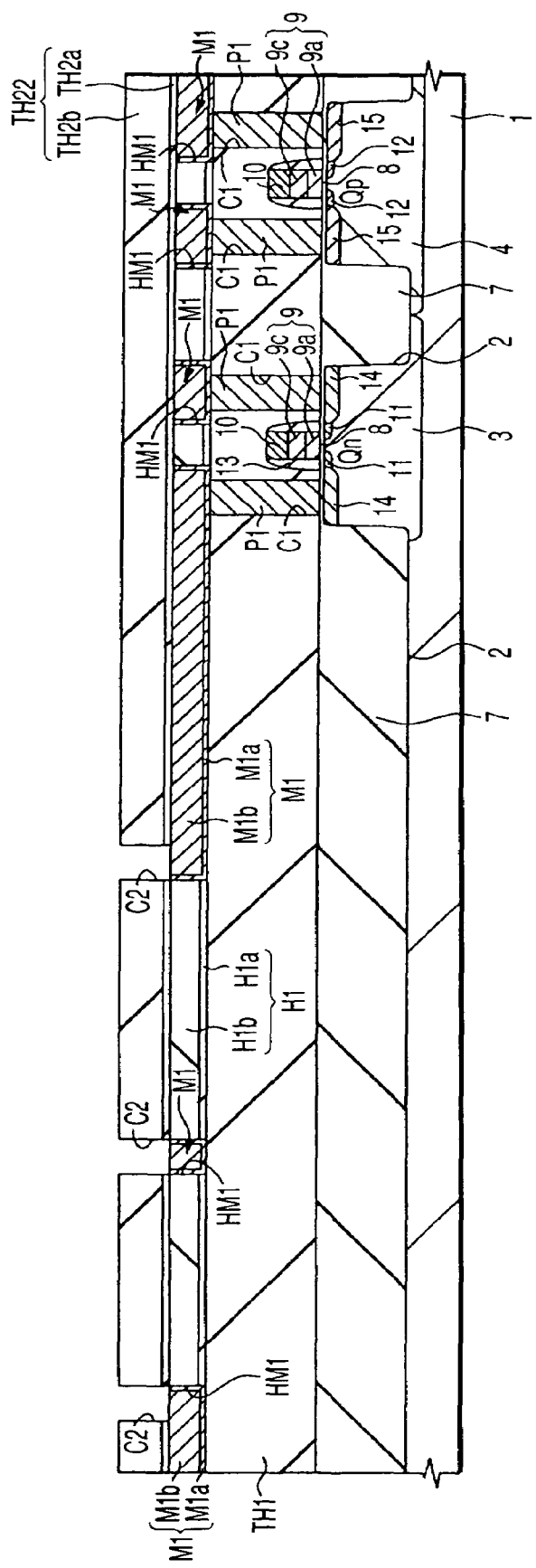
FIG. 33 is a fragmentary cross-sectional view of a substrate illustrating a manufacturing method of a semiconductor integrated circuit device according to Embodiment 2 of the present invention.

As illustrated in FIG. 33, a silicon nitride film TH2a and a silicon oxide film TH2b are deposited successively to serve as insulating films by CVD over the first-level interconnect M1 and an interconnect-trench-forming insulating film H1, whereby an interlayer insulating film TH22 is formed. Of these films, the silicon nitride film TH2a functions to prevent diffusion of copper constituting the first-level interconnect M1. It is also utilized as an etching stopper upon formation of a contact hole C2, which will be described later.

Over the interlayer insulating film TH22, a resist film (not illustrated) is formed, having an opening in a region in which a connector portion (plug) is to be formed. Using this resist film as a mask, the interlayer insulating film TH22 (silicon nitride film TH2a and silicon oxide film TH2b) is etched to form a contact hole C2.

Then, in a similar manner to that employed for the formation of the barrier film PM2a in Embodiment 1, a barrier film P2a is formed.

Figure 34:
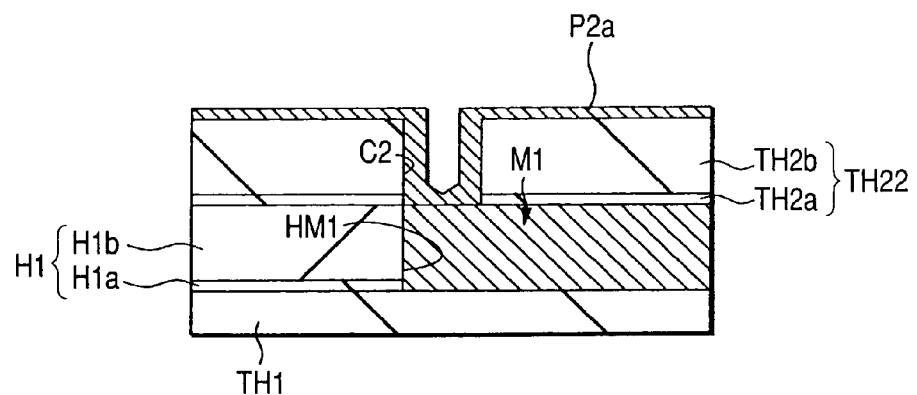
FIG. 34 is a fragmentary cross-sectional view of a substrate illustrating the manufacturing method of the semiconductor integrated circuit device according to Embodiment 2 of the present invention.
Figure 35:
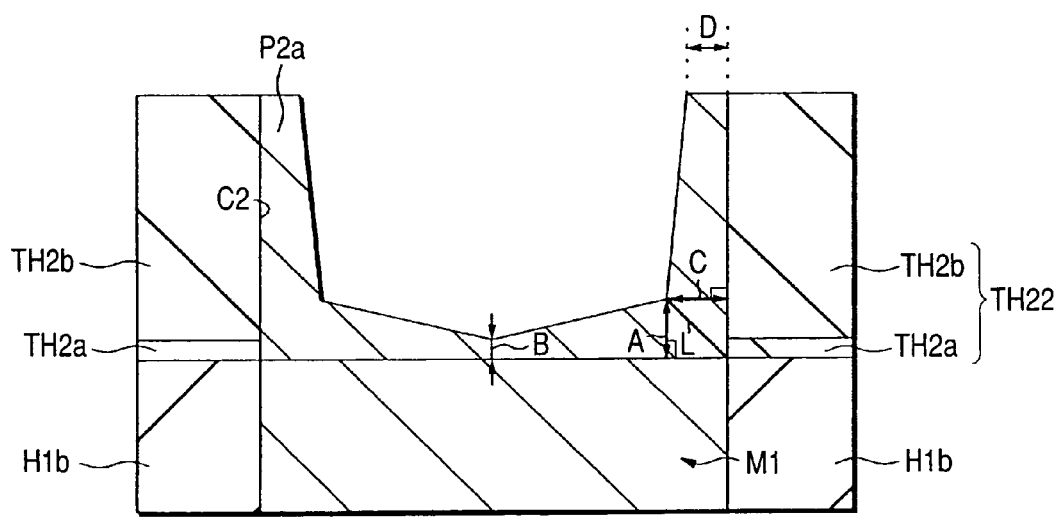
FIG. 35 is a fragmentary cross-sectional view of a substrate illustrating the manufacturing method of the semiconductor integrated circuit device according to Embodiment 2 of the present invention.

More specifically, as illustrated in FIGS. 34 and 35, a refractory metal such as titanium (Ti) is deposited over the interlayer insulating film TH22, including the inside of this contact hole C2, to form the barrier film P2a. In this process, the barrier film P2a on the bottom is formed to have a film thickness that increases from the center of the bottom toward the sidewalls, all around the bottom of the contact hole C2 (refer to FIGS. 5 to 7 in Embodiment 1). The thickness of the barrier film at the center of the bottom of the contact hole C2 is B, and the film thickness A, which is the thickness of the barrier film at the end portions, in the direction of the sidewalls, of the bottom of the contact hole C2, is made greater than the film thickness B (A≧B). Moreover, the film thickness C on the bottom of each of the sidewalls of the contact hole C2 is made greater than the film thickness B (C≧B). FIG. 34 is an enlarged view of the vicinity of the contact hole C2, which is the right-most one among the contact holes C2, as seen in FIG. 33, while FIG. 35 is a partially enlarged view of the bottom of the contact hole C2 shown in FIG. 34.

Figure 36:
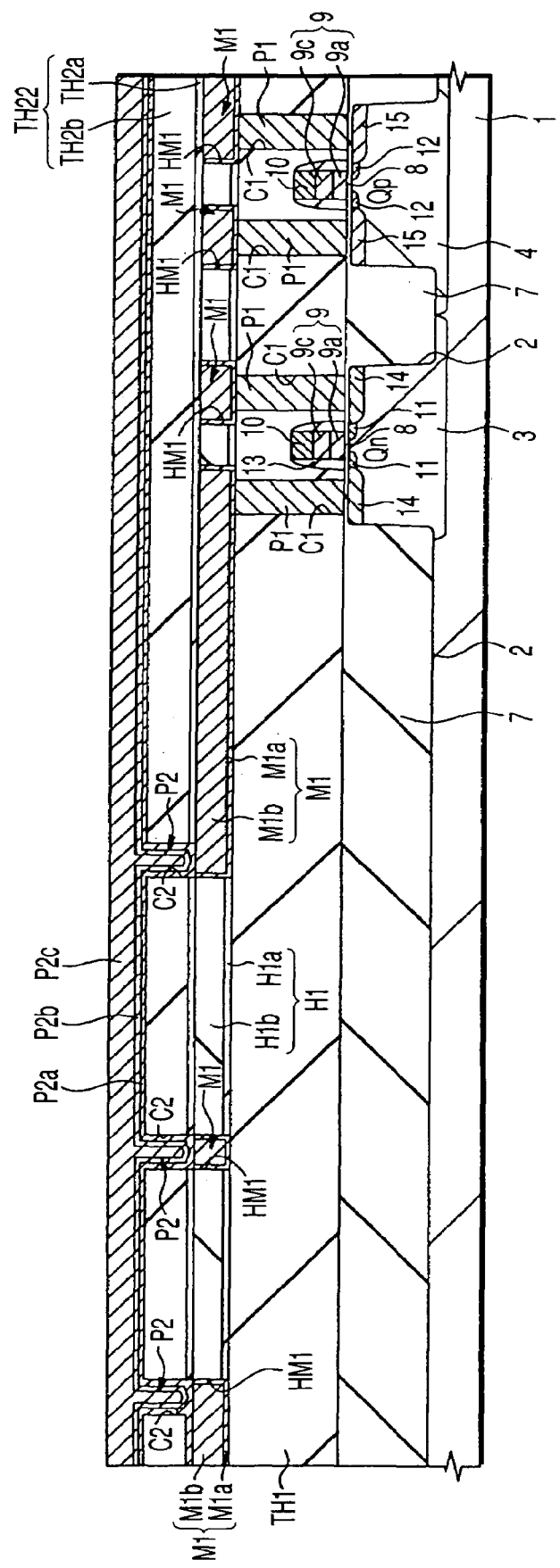
FIG. 36 is a fragmentary cross-sectional view of a substrate illustrating the manufacturing method of the semiconductor integrated circuit device according to Embodiment 2 of the present invention.

As illustrated in FIG. 36, after formation of a copper film P2b on the barrier film P2a by sputtering or CVD to serve as a seed film for electroplating, a copper film P2c is formed as a conductive film over the copper film P2b by electroplating.

Figure 37:
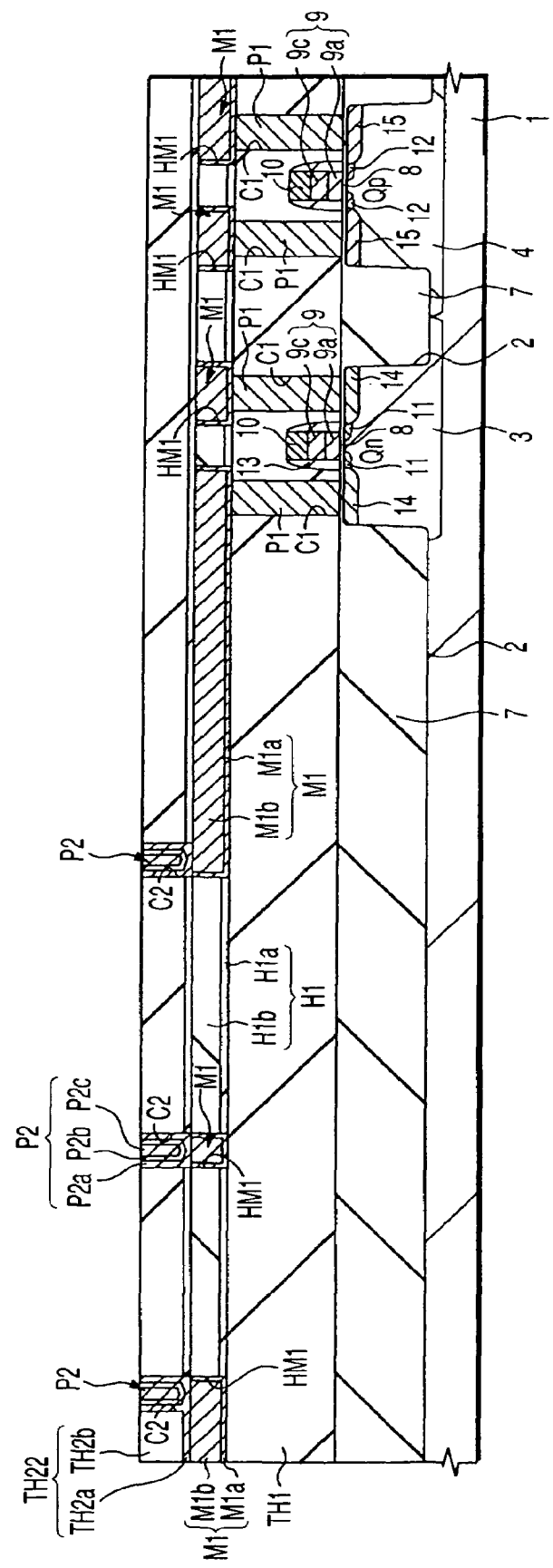
FIG. 37 is a fragmentary cross-sectional view of a substrate illustrating the manufacturing method of the semiconductor integrated circuit device according to Embodiment 2 of the present invention.
Figure 38:
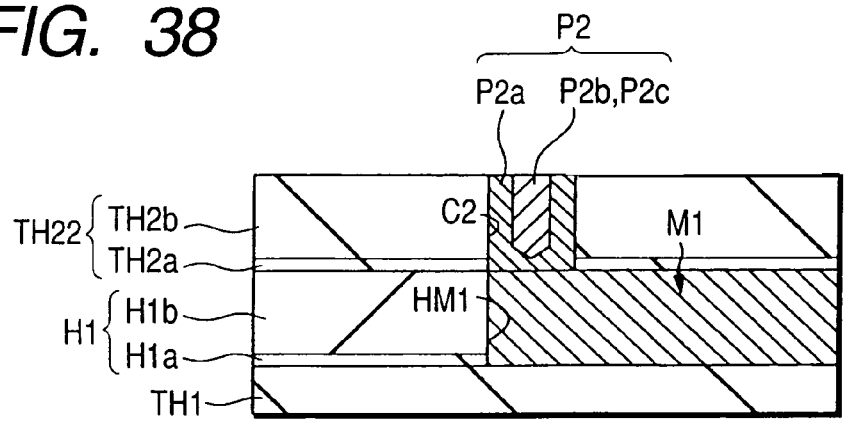
FIG. 38 is a fragmentary cross-sectional view of a substrate illustrating the manufacturing method of the semiconductor integrated circuit device according to Embodiment 2 of the present invention.
Figure 39:
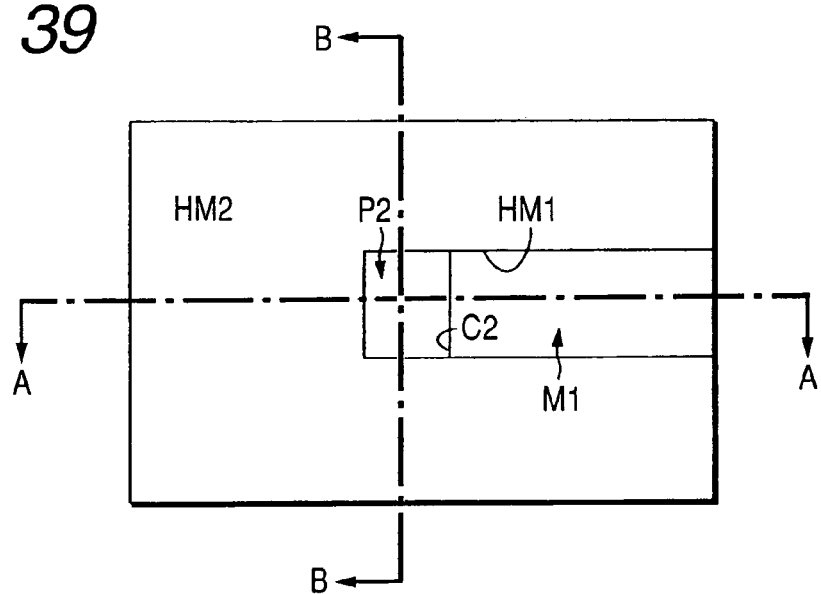
FIG. 39 is a fragmentary cross-sectional view of a substrate illustrating the manufacturing method of the semiconductor integrated circuit device according to Embodiment 2 of the present invention.
Figure 40:
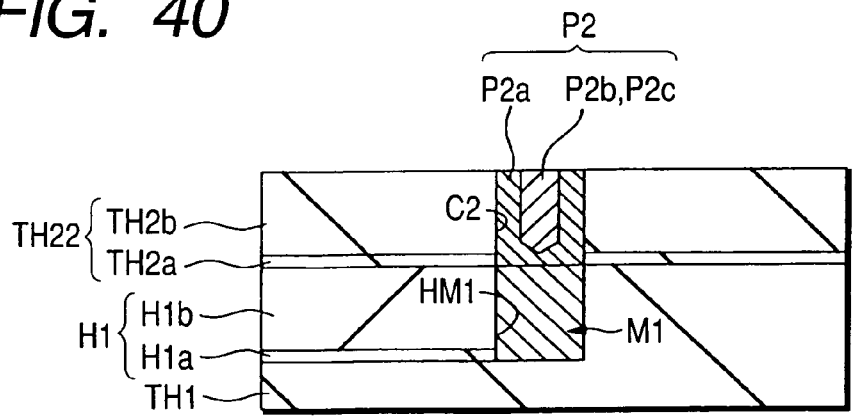
FIG. 40 is a fragmentary cross-sectional view of a substrate illustrating the manufacturing method of the semiconductor integrated circuit device according to Embodiment 2 of the present invention.

The copper films P2b and P2c are heat treated, followed by removal of the copper films P2b and P2c and barrier film P2a outside the contact hole C2 by CMP so as to form a connector portion (plug) P2 between the first-level interconnect M1 and the second-level interconnect M2, as illustrated in FIG. 37. FIG. 38 and FIG. 40 are enlarged views of the vicinity of a contact hole C2, which is the right-most one among the three contact holes C2 as seen in FIG. 37. FIG. 39 is a fragmentary plan view of the substrate shown in FIG. 38 and FIG. 40. FIG. 38 corresponds to a A-A cross-section of FIG. 39, while FIG. 40 corresponds to a B-B cross-section of FIG. 39. As illustrated therein, the connector portion (plug) P2 has a similar constitution to that of the connector portion (plug) P2 described with reference to Embodiment 1.

Figure 41:
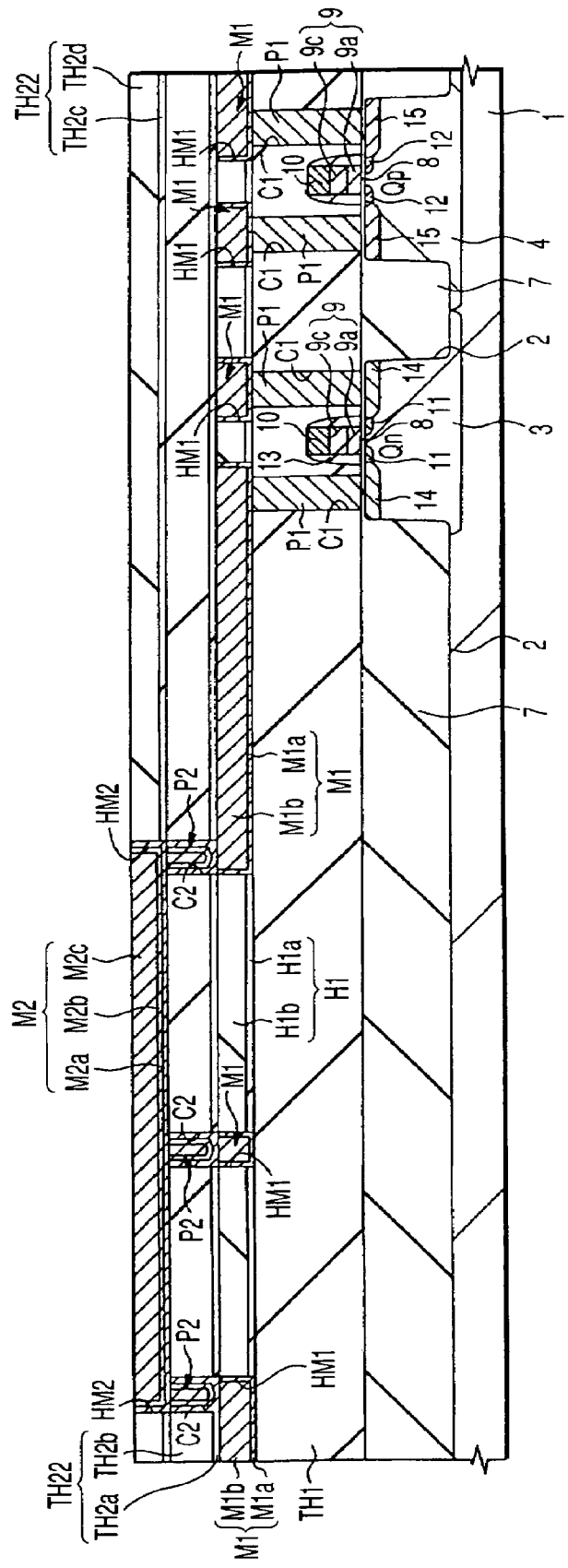
FIG. 41 is a fragmentary cross-sectional view of a substrate illustrating the manufacturing method of the semiconductor integrated circuit device according to Embodiment 2 of the present invention.

As illustrated in FIG. 41, over the interlayer insulating film TH22 and plug P2, a silicon nitride film TH2 and a silicon oxide film TH2d, serving as insulating films, are deposited successively by CVD to form an interconnect-trench-forming insulating film H22. Of these films, the silicon nitride film TH2c serves as an etching stopper upon formation of an interconnect trench HM2, which will be described later.

Over the interconnect-trench-forming insulating film H22, a resist film (not illustrated) is formed, having an opening in a region in which a second-level interconnect is to be formed. Using this resist film as a mask, the interconnect-trench-forming insulating film H2 (silicon oxide film TH2d and silicon nitride film TH2c) is etched to form the interconnect trench HM2.

Over the interlayer insulating film TH2, including the inside of the interconnect trench HM2, a refractory metal, for example, Ti (titanium), is deposited to form a barrier film M2a.

After formation of a copper film M2b over the barrier film M2a by sputtering or CVD to serve as a seed film for electroplating, a copper film M2c is formed thereover to serve as a conductive film by electroplating.

The copper films M2b and M2c are heat treated, followed by removal of the copper films 2b and M2c and the barrier film M2a outside the interconnect trench HM2 by CMP to form the second-level interconnect M2.

Figure 42:
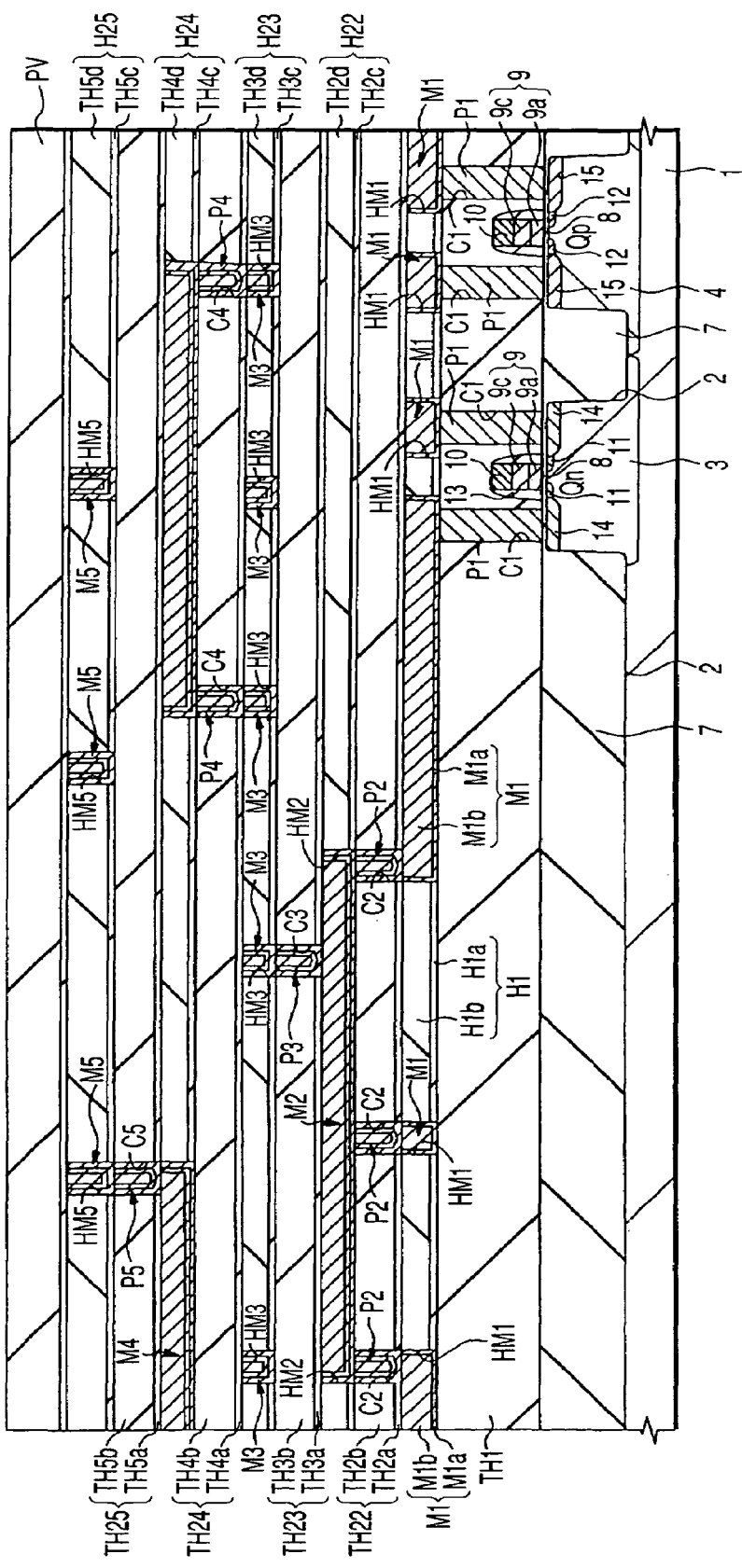
FIG. 42 is a fragmentary cross-sectional view of a substrate illustrating the manufacturing method of the semiconductor integrated circuit device according to Embodiment 2 of the present invention.

By repeating the formation of interlayer insulating films (TH23 to TH25), connector portions (P3 to P5), interconnect-trench-forming insulating films (H23 to H25) and interconnects (M3 to M5), a five-layer interconnect is formed, as illustrated in FIG. 42. They are formed in a similar manner to those employed for the formation of the interlayer insulating film TH2, connecting portion (plug) P2, interconnect-trench-forming insulating film H22, and second-level interconnect M2.

After formation of a silicon nitride film, to serve as a copper diffusion preventive film, over the fifth-level interconnect M5, as in Embodiment 1, a laminate film PV of a silicon oxide film and a silicon nitride film is formed by deposition to serve as a protective film. By this, the barrier films P3a, P4a and P5a on the bottoms of the contact holes C3, C4 and C5 are each formed to have a film thickness that increases from the center of the bottom toward the sidewalls, all around the bottom of the contact hole as in Embodiment 1.

According to this Embodiment, the barrier film P2a on the bottom of the contact hole C2 is formed so that its thickness increases from the bottom of the contact hole toward its sidewalls, as described in Embodiment 1. The geometrically shortest route of an electric current from the second-level interconnect M2 to the first-level interconnect M1, therefore does not cross over a thin portion (a portion whose electric resistance becomes the lowest) of the barrier film, whereby a concentration of electrons to this portion can be prevented. As a result, the electromigration properties can be improved.

By setting the film thickness C to be greater than the film thickness B, a concentration of electrons can be prevented even if overetching not greater than the film thickness A is conducted upon formation of the contact hole C2.

Embodiment 3

The semiconductor integrated circuit device according to this Embodiment of the present invention will be described in accordance with its manufacturing process. FIGS. 43 to 51 are fragmentary cross-sectional or fragmentary plan views of a substrate for illustrating the manufacturing process of the semiconductor integrated circuit device according to Embodiment 3 of the present invention. Since the steps up to the formation of the first-level interconnect M1 are similar to those employed for Embodiment 1, which steps were described with reference to FIGS. 1 and 2, a repeated description of them is omitted.

Figure 43:
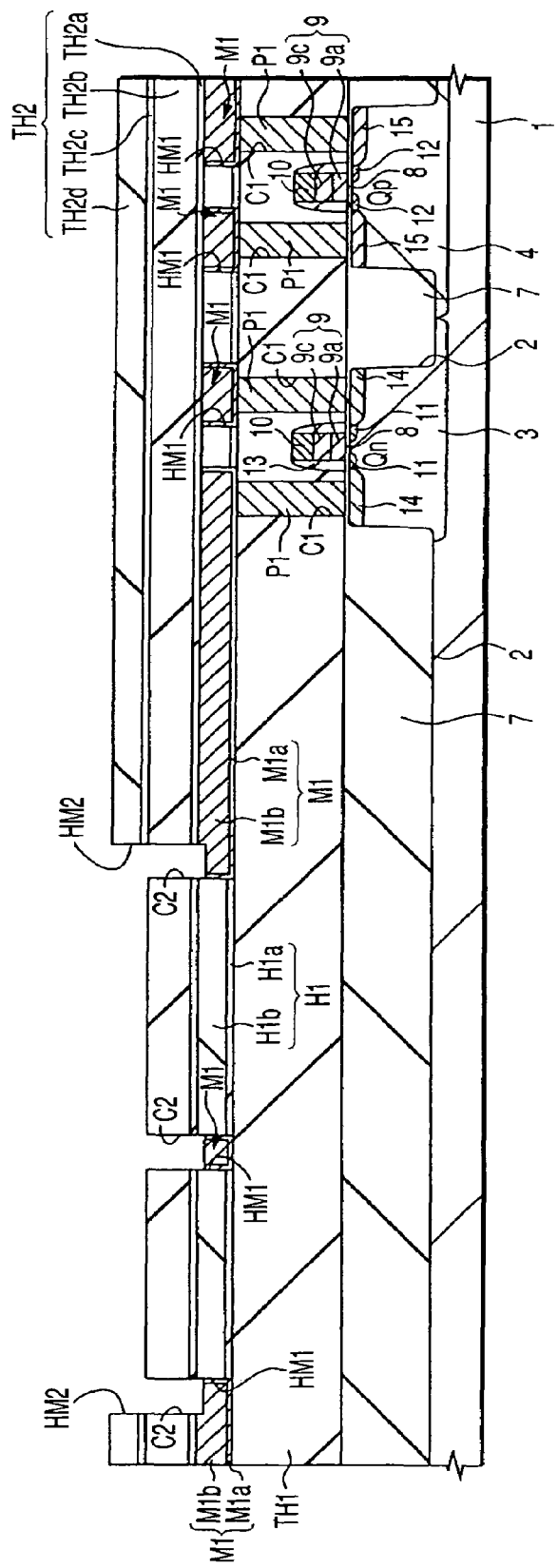
FIG. 43 is a fragmentary cross-sectional view of a substrate illustrating a manufacturing method of a semiconductor integrated circuit device according to Embodiment 3 of the present invention.

As illustrated in FIG. 43, a silicon nitride film TH2a, a silicon oxide film TH2b, a silicon nitride film TH2c and a silicon oxide film TH2d are deposited successively by CVD to serve as an insulating film over the first-level interconnect M1 and interconnect-trench-forming insulating film H1, whereby an interlayer insulating film TH2 is formed. Of these films, the silicon nitride film TH2a has a function of preventing diffusion of copper constituting the first-level interconnect M1. It is also utilized as an etching stopper upon formation of a contact hole C2, which will be described later. The silicon nitride film TH2c serves as an etching stopper upon formation of an interconnect trench HM2, which will be described later.

Over the interlayer insulating film TH2, a resist film (not illustrated) is formed, that is opened at a region in which a second interconnect is to be formed. Using this resist film as a mask, the silicon oxide film TH2d and silicon nitride film TH2c are etched from the interlayer insulating film TH2 to form the interconnect trench HM2.

Over the interlayer insulating film TH2, including the inside of the interconnect trench HM2, a first resist film (not illustrated) is deposited. The interconnect trench HM2 is embedded with the first resist film by etch back. A second resist film (not illustrated), that is opened at a connecting region of the first-level interconnect with the second-level interconnect, is then formed over the first resist film. Using this second resist film as a mask, the first resist film, silicon oxide film TH2b and silicon nitride film TH2a are etched, whereby the contact hole (C2) is formed. As described with reference to Embodiment 1, the interconnect trench HM2 may be formed after the formation of the contact hole C2.

If overetching is conducted upon formation of this contact hole C2, the bottom of the contact hole C2 comes at a position deeper than the surface of the first-level interconnect M1 as illustrated in FIG. 43.

Figure 44:
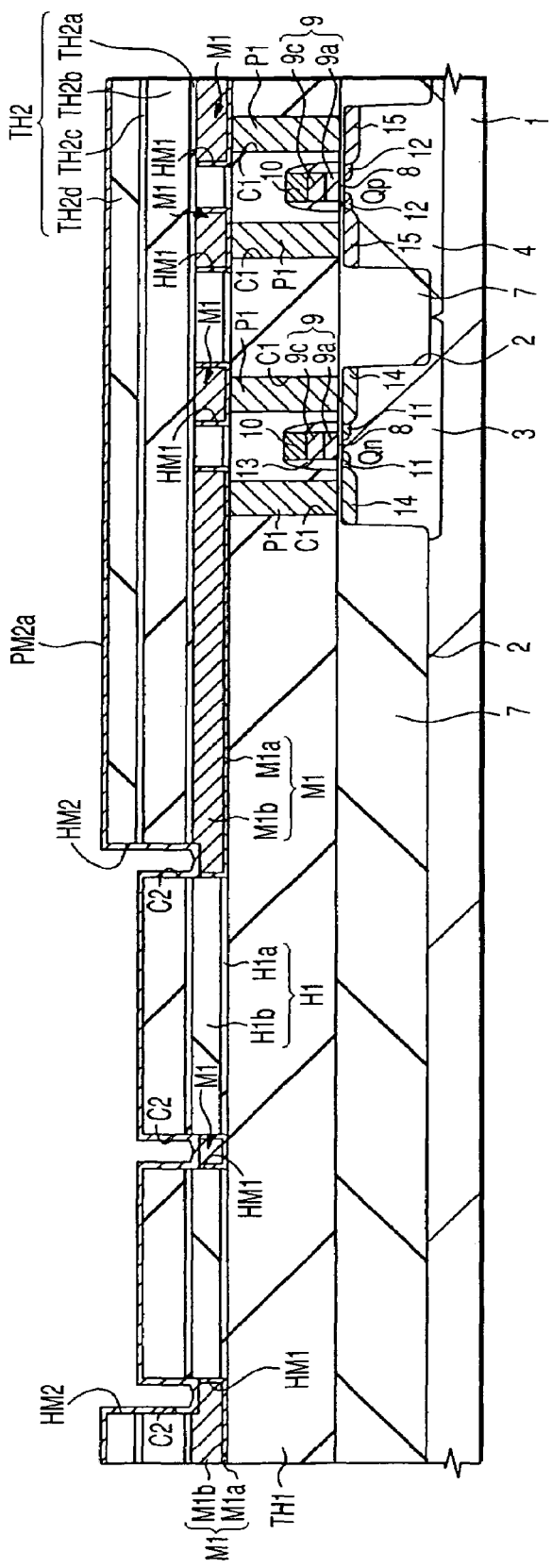
FIG. 44 is a fragmentary cross-sectional view of a substrate illustrating the manufacturing method of the semiconductor integrated circuit device according to Embodiment 3 of the present invention.

As illustrated in FIG. 44, a refractory metal such as Ti (titanium), is deposited over the interlayer insulating film TH2, including the insides of the contact hole C2 and interconnect trench HM2, whereby a barrier film PM2a is formed. The barrier film PM2a is formed to have the below-described structure.

Figure 45:
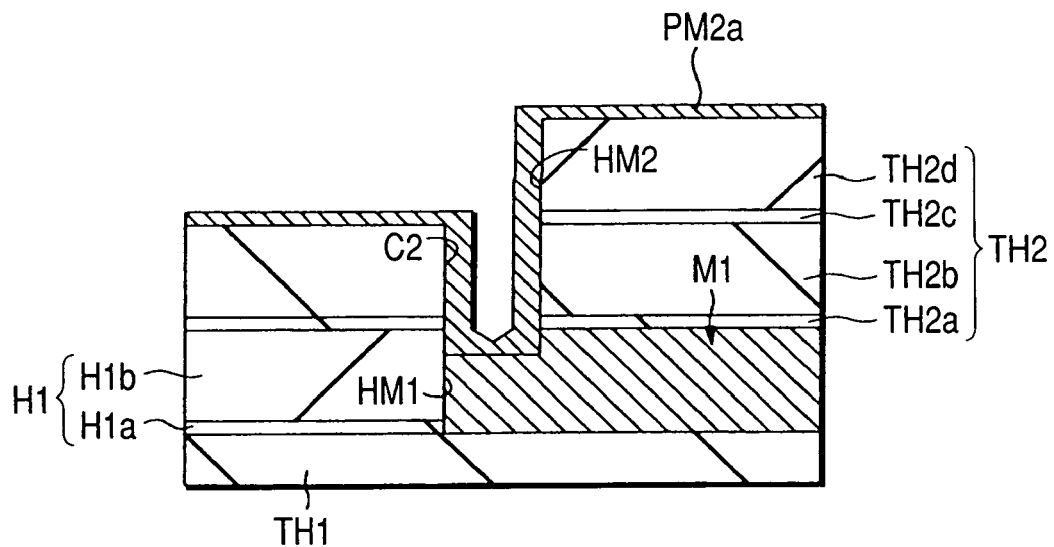
FIG. 45 is a fragmentary cross-sectional view of a substrate illustrating the manufacturing method of the semiconductor integrated circuit device according to Embodiment 3 of the present invention.
Figure 46:
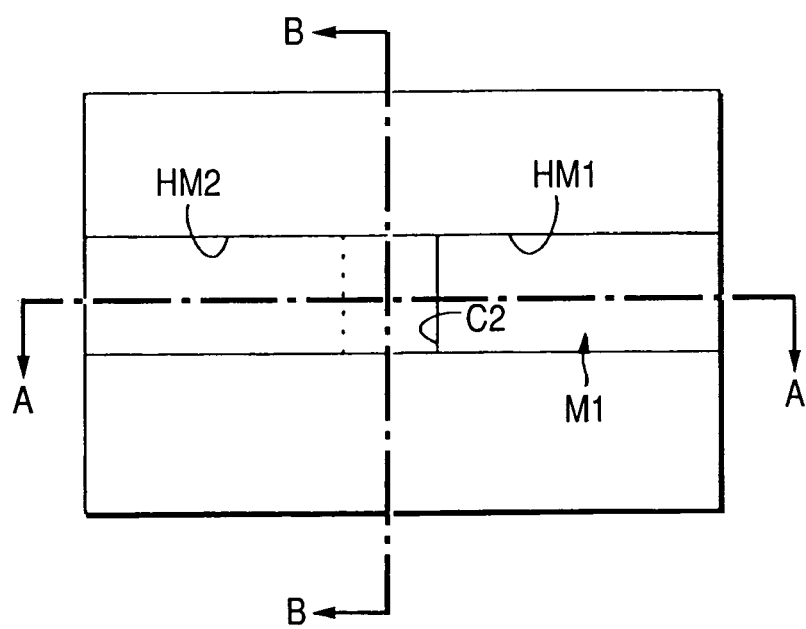
FIG. 46 is a fragmentary cross-sectional view of a substrate illustrating the manufacturing method of the semiconductor integrated circuit device according to Embodiment 3 of the present invention.
Figure 47:
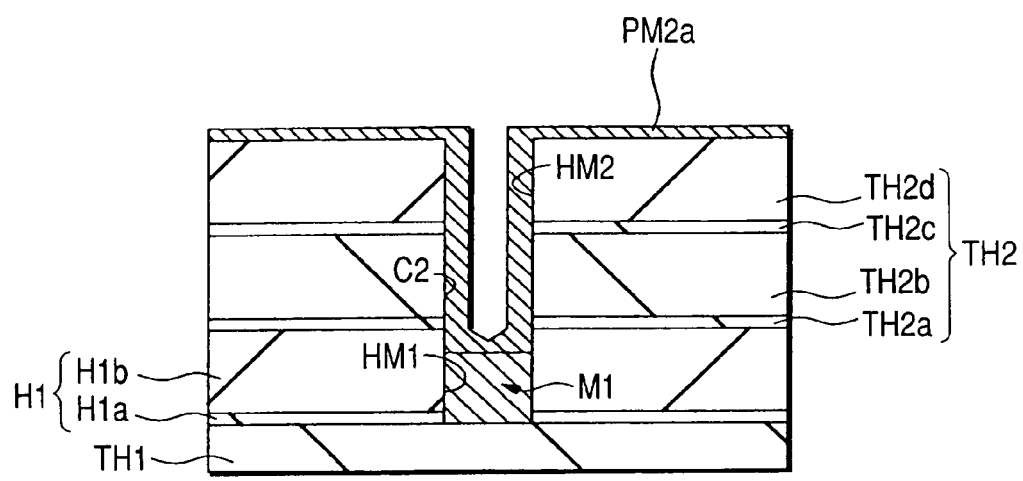
FIG. 47 is a fragmentary cross-sectional view of a substrate illustrating the manufacturing method of the semiconductor integrated circuit device according to Embodiment 3 of the present invention.

FIGS. 45 and 47 are each an enlarged view of the vicinity of the contact hole C2 shown in FIG. 44. FIG. 46 is a fragmentary plan view of the substrate illustrated in FIGS. 45 and 47. FIG. 45 illustrates a A-A cross-section of FIG. 46, while FIG. 47 corresponds to a B-B cross-section of FIG. 46. As illustrated in FIGS. 45 and 47, the barrier film PM2a is formed along the bottom and sidewalls of the interconnect trench HM2 or contact hole C2.

Figure 48:
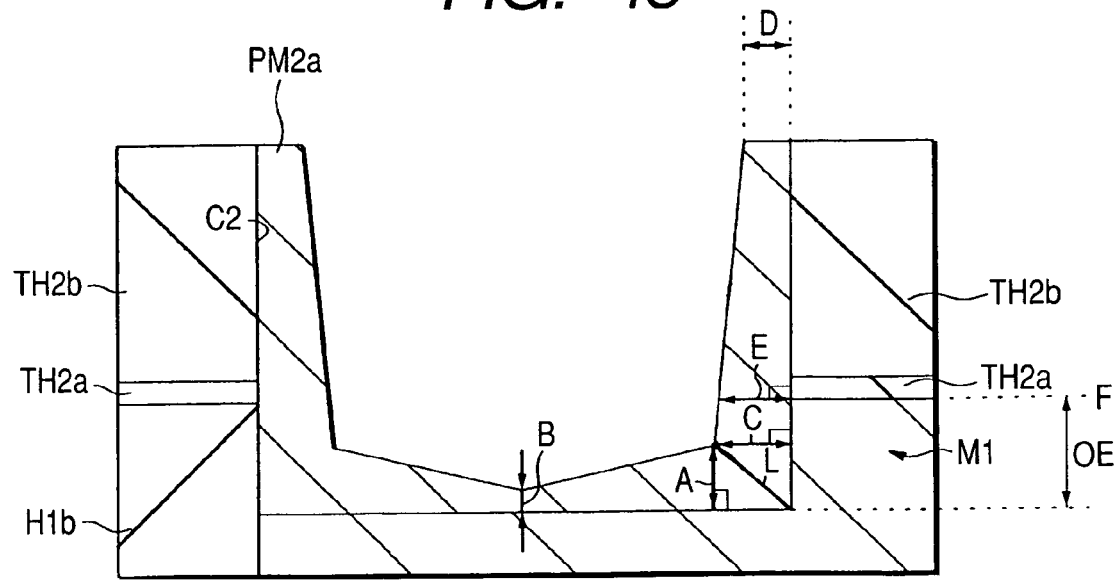
FIG. 48 is a fragmentary cross-sectional view of a substrate illustrating the manufacturing method of the semiconductor integrated circuit device according to Embodiment 3 of the present invention.

In the contact hole C2, the barrier film PM2a on the bottom thereof is formed so that its film thickness increases from the center of the bottom of the contact hole C2 toward the sidewalls, all around the bottom of the contact hole C2. As illustrated in FIG. 48, which is a partially enlarged view of the bottom of the contact hole C2 shown in FIG. 47, the thickness of the barrier film at the center of the bottom of the contact hole C2 is B, and the film thickness A, which is a thickness on the end portion, in the direction of the sidewall, of the bottom of the contact hole C2 is made greater than the film thickness B ($A \geq B$). The barrier film on the sidewalls increases in thickness from a portion above a position contiguous to the surface F of the first-level interconnect M1 toward the bottom of the contact hole C2. The film thickness E of the barrier film PM2a, that is contiguous to the surface F of the first-level interconnect M1, is the thickness on the sidewall, and it is greater than the film thickness B ($E \geq B$).

As illustrated in Embodiment 1, the film thickness B or the film thickness D of the barrier film on the sidewalls of the contact hole C2 must be adjusted to at least the minimum thickness permitting maintenance of barrier properties.

Figure 49:
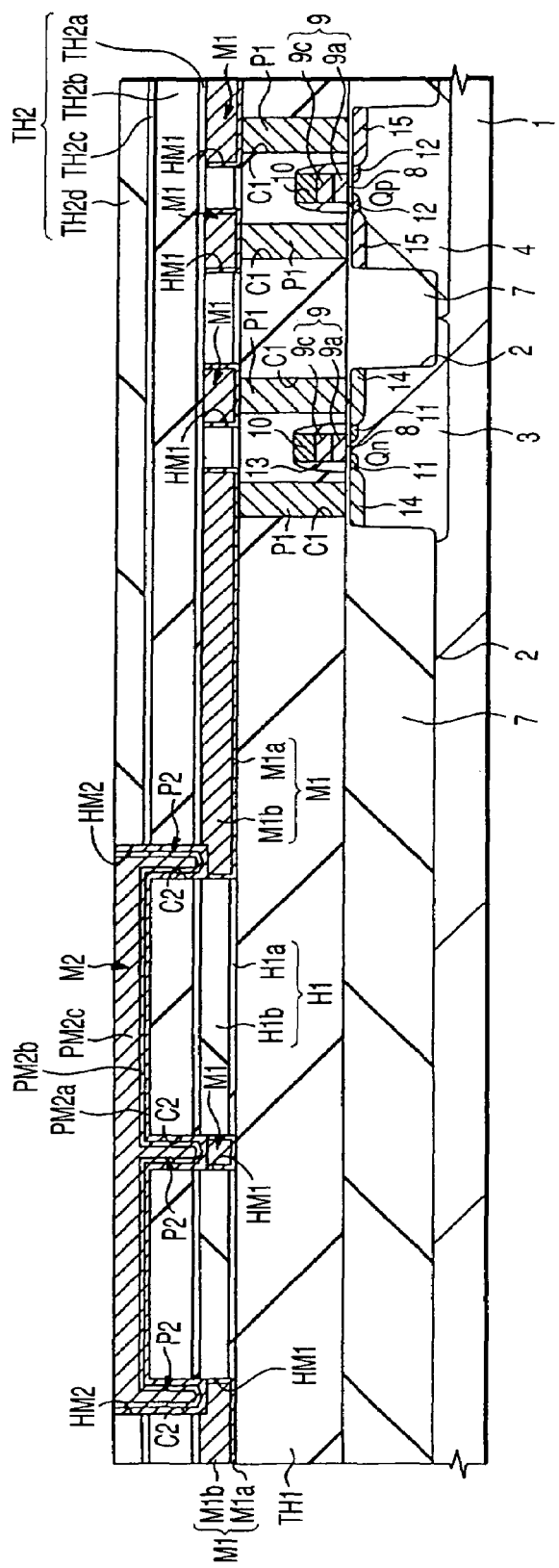
FIG. 49 is a fragmentary cross-sectional view of a substrate illustrating the manufacturing method of the semiconductor integrated circuit device according to Embodiment 3 of the present invention.

As illustrated in FIG. 49, after formation of a copper film PM2b over the barrier film PM2a by sputtering or CVD to serve as a seed film for electroplating, a copper film PM2c is formed, to serve as a conductive film, over the copper film PM2b by electroplating.

Figure 50:
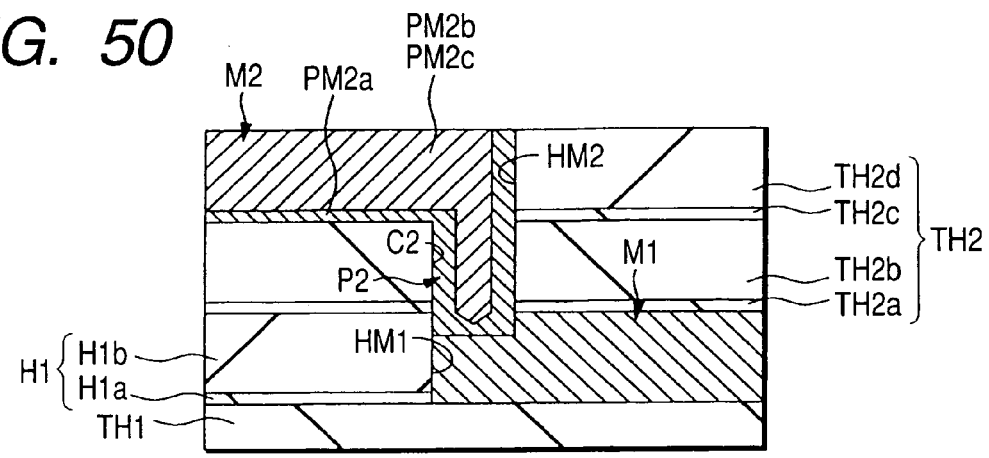
FIG. 50 is a fragmentary cross-sectional view of a substrate illustrating the manufacturing method of the semiconductor integrated circuit device according to Embodiment 3 of the present invention.
Figure 51:
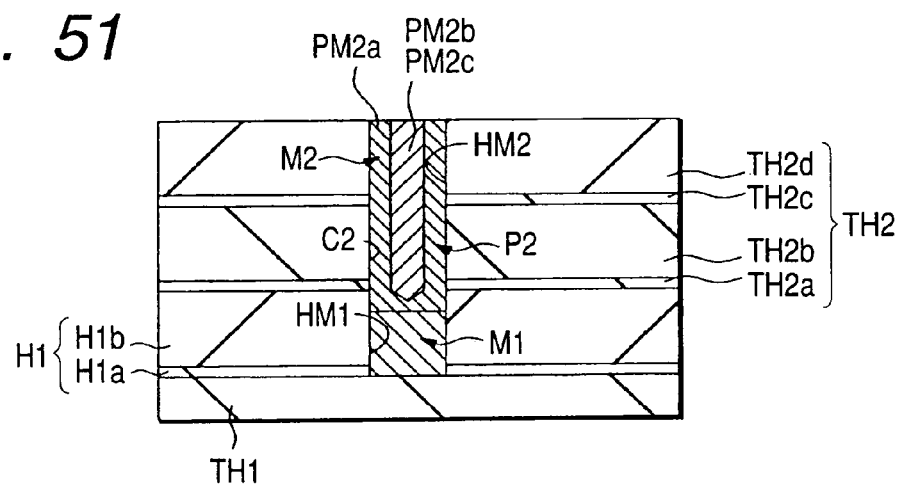
FIG. 51 is a fragmentary cross-sectional view of a substrate illustrating the manufacturing method of the semiconductor integrated circuit device according to Embodiment 3 of the present invention.

After heat treatment of the copper films PM2b and PM2c, the copper films PM2b, PM2c and barrier film PM2a outside the interconnect HM2 and contact hole C2 are removed by CMP to form a second-level interconnect M2 and a connector portion (plug) P2 between the first-level interconnect and the second-level interconnect. FIGS. 50 and 51 are enlarged views of the vicinity of the contact hole C2 shown in FIG. 49. FIGS. 50 and 51 correspond to the A-A cross-section and B-B cross-section of FIG. 46, respectively.

The essential points in the structure of the second-level interconnect M2, connector portion (plug) and first-level interconnect M1 will be described.

The second-level interconnect M2 and connector portion (plug) P2 are each made of the copper films PM2b, PM2c and barrier film PM2a. As illustrated in FIG. 50, the second-level interconnect M2 extends to the left side, starting from the connector portion (plug) 2, while the first-level interconnect M1 extends to the right side, starting from the connector portion (plug) P2.

As described above, the barrier film PM2a on the bottom of the contact hole C2 increases in thickness from the center of the bottom toward the sidewalls. In other words, the barrier film PM2a has a portion that declines toward the center of the bottom from the sidewalls of the contact hole C2. The film thickness B of the barrier film on the center of the bottom of the contact hole C2 is smaller than the film thickness A, which is the film thickness at an end portion, in the direction of sidewalls, of the bottom of the contact hole C2 ($A \geq B$). The film thickness A can be determined, for example, by dropping a perpendicular line toward the bottom of the contact hole C2 from the end of the shortest distance L between the corner of the bottom of the contact hole C2 to the surface of the barrier film.

The actual surface of the barrier film is, as illustrated in FIG. 15, curved at the corner of the bottom of the contact hole. When the contact hole has a curved corner, as illustrated in FIG. 16, the above-described shortest distance L can be determined by using, as a starting point, the intersection between the extended side line and extended bottom line of the contact hole C2.

The connector portion (plug) P2 has a bottom at a position deeper by an overetching amount OE from the surface F of the first-level interconnect M1, and the film thickness E of the barrier film PM2a, at a portion contiguous to the surface F of this first-level interconnect M1, is greater than the film thickness B (refer to FIG. 48).

According to this Embodiment, the film thickness E is greater than the film thickness B, so that the geometrically shortest route Ru1 (refer to FIG. 52), when an electric current flows from the second-level interconnect M2 toward the first-level interconnect M1, does not cross over a thin portion of the barrier film at which the electric resistance becomes the lowest.

According to this Embodiment, the geometrically shortest route of electric current from the second-level interconnect M2 to the first-level interconnect M1 does not coincide with a thin portion of the barrier film PM2a at which the electrical resistance becomes lowest, so that the current route can be dispersed. Accordingly, a concentration of electrons (e) does not occur easily, even if overetching occurs upon formation of the contact hole C2, making it possible to improve the electromigration properties.

Figure 52:
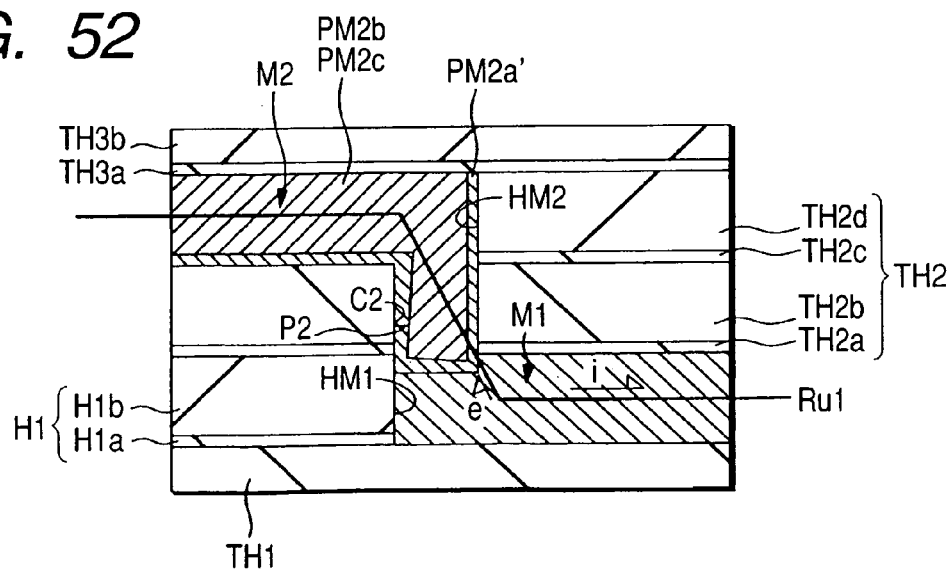
FIG. 52 is a fragmentary cross-sectional view of a substrate of the semiconductor integrated circuit device showing the effect of Embodiment 3 of the present invention.

As described in Embodiment 1, when the barrier film has some variations in its thickness inside of the contact hole (refer to FIG. 19), and, moreover, when overetching occurs upon formation of the contact hole C2, the geometrically shortest route (route Ru1) of an electric current crosses over the sidewalls of the barrier film PM2a', as illustrated in FIG. 52.

When the thickness of the barrier film contiguous to the surface of the first-level interconnect M1 is smaller than that on the bottom of the contact hole, the geometrically shortest route of an electric current coincides with a thin portion of the barrier film PM2a whose electrical resistance becomes the lowest, which causes a concentration of electrons (e), and deteriorates the electromigration properties.

In this Embodiment, on the other hand, when the film thickness E of the barrier film, which is contiguous to the surface F of the first-level interconnect M1, is set to be greater than the film thickness B, the above-described effect is available.

In similar a manner to that employed for the formation of the second-level interconnect M2 and connector portion (plug) P2, third-level to fifth-level interconnects M3 to M5 and connector portions (plugs) P1 to P5 are then formed. However, illustrations and a detailed description thereof will be omitted.

In this Embodiment, the second-level interconnect M2 and connector portion (plug) 2 were formed using the dual damascene method. Alternatively, the second-level interconnect M2 and connector portion (plug) 2 were formed by separate steps by using the single damascene method, as described with reference to Embodiment 2. Also, in this case, the above-described effect is available by setting the film thickness E of the barrier film PM2a in the connector portion (plug) to be greater than the film thickness B.

The present invention has been described specifically on the basis of various Embodiments. However, the present invention is not limited by these Embodiments, but can be modified to an extent not departing from the gist of the invention.

For example, MISFETQn and MISFETQp were given as examples of a semiconductor element. Not only a MISFET, but also another element, such as bipolar transistor, can be formed.

Effects available by the typical aspects of the invention, among the features disclosed by the present application, will be described briefly below.

(1) A conductive film on the bottom and sidewalls of a hole made in an insulating film formed over a semiconductor substrate is formed so that its thickness increases from the center of the hole toward the side walls, whereby the geometrically shortest route of an electric current in the hole does not coincide with a thin portion of the conductive film at which the electrical resistance becomes the lowest, which makes it possible to disperse the route of electrical current.

By such a constitution, a concentration of electrons does not occur readily, and the electromigration properties can be improved. Moreover, the characteristics of a semiconductor integrated circuit device having such a conductive film can be improved.

As a result, the yield of the product can be heightened, and its life (electromigration life) can be prolonged.

(2) When the bottom of the hole exists at a position deeper than the surface of the interconnect extending therebelow, a conductive film on the bottom and sidewalls is formed so that the film thickness E of the conductive film that is contiguous to the surface of the interconnect becomes greater than the film thickness B. The geometrically shortest route of an electrical current in the hole, therefore, does not coincide with a thin portion of the conductive film at which the electrical resistance becomes the lowest, which makes it possible to disperse the route of the electrical current.

By such a constitution, a concentration of electrons does not occur readily, and the electromigration properties can be improved. Moreover, the characteristics of a semiconductor integrated circuit device having such a conductive film can be improved.

As a result, the yield of the product can be heightened, and its life (electromigration life) can be prolonged.

What is claimed:

1. A method of manufacturing a semiconductor integrated circuit device, comprising steps of:
    (a) forming a first insulating film over a semiconductor substrate;
    (b) forming a first wiring in said first insulating film;
    (c) forming a second insulating film over said first wiring;
    (d) forming a third insulating film over said second insulating film;
    (e) forming a hole by etching said second and third insulating films, said hole being extended to said first wiring;
    (f) etching a surface of said first wiring;
    (g) forming a first conductive film over the bottom and sidewalls of said hole, said first conductive film having a function of a barrier film to a copper film; and
    (h) forming a second conductive film over said first conductive film such that said second conductive film is embedded in said hole, said second conductive film being formed of a copper film or a film of a copper alloy and is formed of different material from that of said first conductive film,
        wherein a thickness of said first conductive film at the center of the bottom of said hole is smaller than a surface amount of said etching in said step (f),
        wherein a width of said second conductive film formed under said surface of said first wiring is smaller than a width of said second conductive film formed over said surface of said first wiring,
        wherein said width of said second conductive film is decreasing continuously toward the bottom of said hole from the surface of said second insulating film, and
        wherein a rate of decrease in said second conductive film formed under said surface of said first wiring is larger than a rate of decrease in said second conductive film formed over said surface of said first wiring.

2. A method of manufacturing a semiconductor integrated circuit device according to the claim 1,
    wherein a thickness of said first conductive film on the sidewalls of said hole is larger than said thickness of said first conductive film at the center of the bottom of said hole.

3. A method of manufacturing a semiconductor integrated circuit device according to the claim 1,
    wherein said first conductive film has an upwardly sloping film thickness thereof from the center of the bottom of said hole toward the sidewalls of said hole all around a region defining the bottom of said hole.

4. A method of manufacturing a semiconductor integrated circuit device according to the claim 1, wherein said first conductive film has a declining portion declining from the sidewalls toward the center of the bottom of said hole all around a region defining the bottom of said hole.

5. A method of manufacturing a semiconductor integrated circuit device according to the claim 1,
wherein said first conductive film is made of tantalum (Ta), tantalum nitride (TaN), titanium (Ti), titanium nitride (TiN), tungsten (W), tungsten nitride (WN), titanium silicide nitride (TiSiN) or tungsten suicide nitride (WSiN), or an alloy thereof, or a laminate film thereof.

6. A method of manufacturing a semiconductor integrated circuit device according to the claim 1,
wherein in said step (g), said first conductive film is formed by a method of bias sputtering.

7. A method of manufacturing a semiconductor integrated circuit device, comprising steps of:
   (a) forming a first insulating film over a semiconductor substrate;
   (b) forming a first wiring in said first insulating film;
   (c) forming a second insulating film over said first wiring;
   (d) forming a third insulating film over said second insulating film;
   (e) forming a hole by etching said second and third insulating films, said hole being extended to said first wiring;
   (f) etching a surface of said first wiring;
   (g) forming a first conductive film over the bottom and sidewalls of said hole, said first conductive film having a function of a barrier film to a copper film; and
   (h) forming a second conductive film over said first conductive film such that said second conductive film is embedded in said hole, said second conductive film being formed of a copper film or a film of a copper alloy and is formed of different material from that of said first conductive film,
   wherein a thickness of said first conductive film at the center of the bottom of said hole is smaller than a surface amount of said etching in said step (f), and
   wherein a width of said second conductive film is decreasing continuously toward the bottom of said hole from the surface of said second insulating film, and
   wherein a rate of decrease in said second conductive film formed under said surface of said first wiring is larger than a rate of decrease in said second conductive film formed over said surface of said first wiring.

8. A method of manufacturing a semiconductor integrated circuit device according to the claim 7,
wherein a thickness of said first conductive film of the sidewalls on said hole is larger than said thickness of said first conductive film at the center of the bottom of said hole.

9. A method of manufacturing a semiconductor integrated circuit device according to the claim 7,
wherein said first conductive film has an upwardly sloping film thickness thereof from the center of the bottom of said hole toward the sidewalls of said hole all around a region defining the bottom of said hole.

10. A method of manufacturing a semiconductor integrated circuit device according to the claim 7,
wherein said first conductive film has a declining portion declining from the sidewalls toward the center of the bottom of said hole all around a region defining the bottom of said hole.

11. A method of manufacturing a semiconductor integrated circuit device according to the claim 7,
wherein said first conductive film is made of tantalum (Ta), tantalum nitride (TaN), titanium (Ti), titanium nitride (TiN), tungsten (W), tungsten nitride (WN), titanium silicide nitride (TiSiN) or tungsten silicide nitride (WSiN), or an alloy thereof, or a laminate film thereof.

12. A method of manufacturing a semiconductor integrated circuit device according to the claim 7,
wherein in said step (g), said first conductive film is formed by a method of bias sputtering.

* * * * *